US008785931B2

(12) United States Patent
Kinouchi et al.

(10) Patent No.: US 8,785,931 B2
(45) Date of Patent: Jul. 22, 2014

(54) SEMICONDUCTOR DEVICE

(75) Inventors: Shinichi Kinouchi, Tokyo (JP); Hiroshi Nakatake, Tokyo (JP); Yuji Ebiike, Tokyo (JP); Akihiko Furukawa, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/818,993

(22) PCT Filed: Aug. 26, 2011

(86) PCT No.: PCT/JP2011/069298
§ 371 (c)(1),
(2), (4) Date: Feb. 26, 2013

(87) PCT Pub. No.: WO2012/029652
PCT Pub. Date: Mar. 8, 2012

(65) Prior Publication Data
US 2013/0153900 A1    Jun. 20, 2013

(30) Foreign Application Priority Data

Sep. 3, 2010  (JP) ................................ 2010-197384
Sep. 3, 2010  (JP) ................................ 2010-197597

(51) Int. Cl.
*H01L 23/58*  (2006.01)
*H01L 29/78*  (2006.01)

(52) U.S. Cl.
USPC .............. 257/48; 257/77; 257/368; 257/467; 257/E29.255; 438/275

(58) Field of Classification Search
USPC ............ 257/48, 77, 355, 360, 368, 391, 392, 257/467, 469, E29.084, E29.255, E1.051, 257/E21.065; 438/17, 275; 361/93.1, 103; 327/512
See application file for complete search history.

(56) References Cited

U.S. PATENT DOCUMENTS 5,767,545 A * 6/1998 Takahashi ..................... 257/341
5,994,752 A * 11/1999 Sander et al. ................. 257/467
(Continued)

FOREIGN PATENT DOCUMENTS

JP           2 67767        3/1990
JP           9 102505       4/1997
(Continued)

OTHER PUBLICATIONS

International Preliminary Report on Patentability and Written Opinion issued Apr. 9, 2013 in PCT/JP2011/069298 filed on Aug. 26, 2011(with English translation).

(Continued)

*Primary Examiner* — Tuan N. Quach
(74) *Attorney, Agent, or Firm* — Oblon, Spivak, McClelland, Maier & Neustadt, L.L.P.

(57) ABSTRACT

A semiconductor device capable of rapidly and accurately sensing the information regarding the temperature of a semiconductor transistor contained therein. A MOSFET includes a plurality of cells, and includes a main cell group including a cell for supplying a current to a load among the plurality of cells, and a sense cell group including a cell for sensing temperature information regarding the temperature of the MOSFET thereamong. The main cell group and the sense cell group have different temperature characteristics showing changes in electrical characteristics to changes in temperature. A temperature sensing circuit senses the temperature of the MOSFET based on, for example, a value of a main current flowing through the main cell group and a value of a sense current flowing through the sense cell group.

18 Claims, 20 Drawing Sheets

(56) References Cited

U.S. PATENT DOCUMENTS

| | | | |
|---|---|---|---|
| 6,504,697 B1 * | 1/2003 | Hille | 361/103 |
| 7,944,269 B2 * | 5/2011 | Cortigiani et al. | 327/512 |
| 8,120,135 B2 * | 2/2012 | Krischke et al. | 257/467 |
| 2002/0140447 A1 | 10/2002 | Throngnumchai et al. | |
| 2005/0012143 A1 | 1/2005 | Tanaka et al. | |
| 2005/0046463 A1 | 3/2005 | Throngnumchai et al. | |

FOREIGN PATENT DOCUMENTS

| | | |
|---|---|---|
| JP | 2002 289789 | 10/2002 |
| JP | 2004 117111 | 4/2004 |
| JP | 2005 175357 | 6/2005 |
| JP | 2005 322781 | 11/2005 |
| JP | 2006 100690 | 4/2006 |
| JP | 2009 165285 | 7/2009 |

OTHER PUBLICATIONS

International Preliminary Report on Patentability issued Mar. 5, 2013 in PCT/JP2011/069298 filed on Aug. 26, 2011.

Xiao, Y., et al., "Current Sensing Trench Power MOSFET for Automotive Applications," IEEE, vol. 2, pp. 766-770, (2005).

Sze, S., "Physics of Semiconductor Devices, 2nd Edition," John Wiley & Sons, pp. 451-453, (1981).

Lostetter, A., et al., "High-Temperature Silicon Carbide and Silicon on Insulator Based Integrated Power Modules," IEEE, vol. 2, pp. 1032-1035, (2009).

International Search Report Issued Sep. 20, 2011 in PCT/JP11/69298 Filed Aug. 26, 2011.

* cited by examiner

F I G . 1
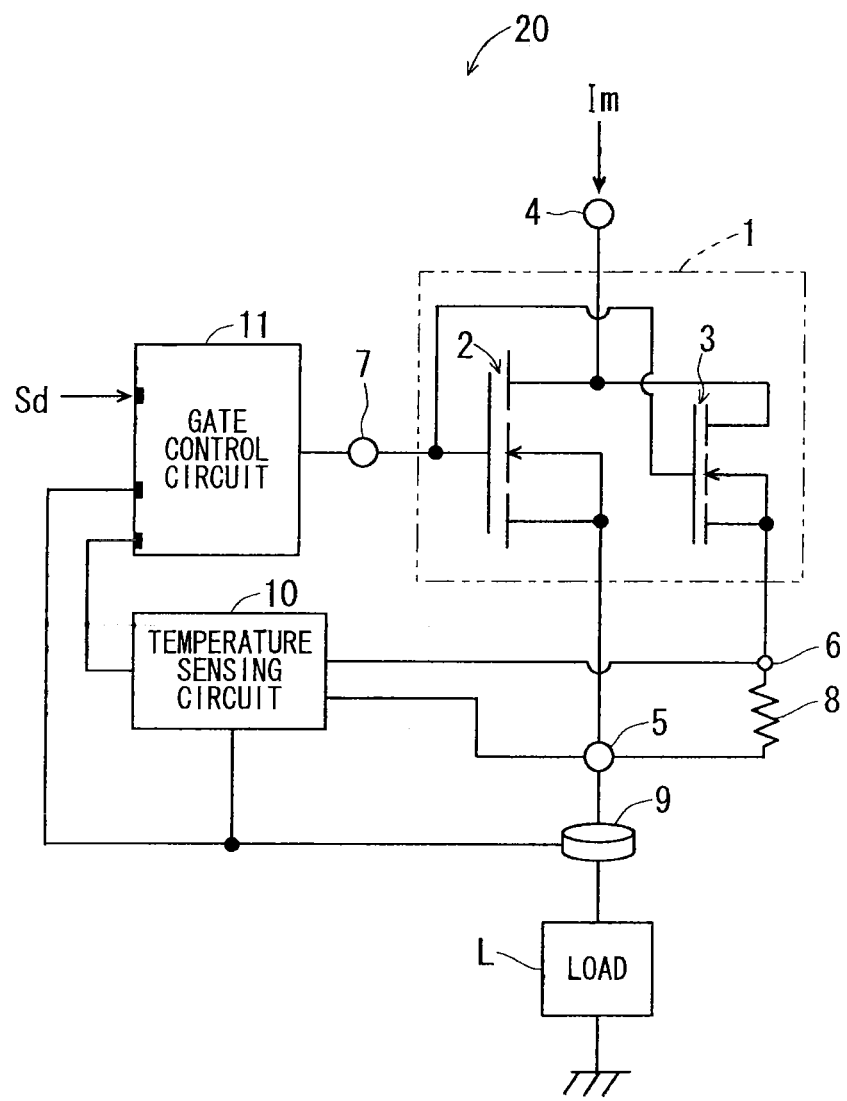

F I G . 3
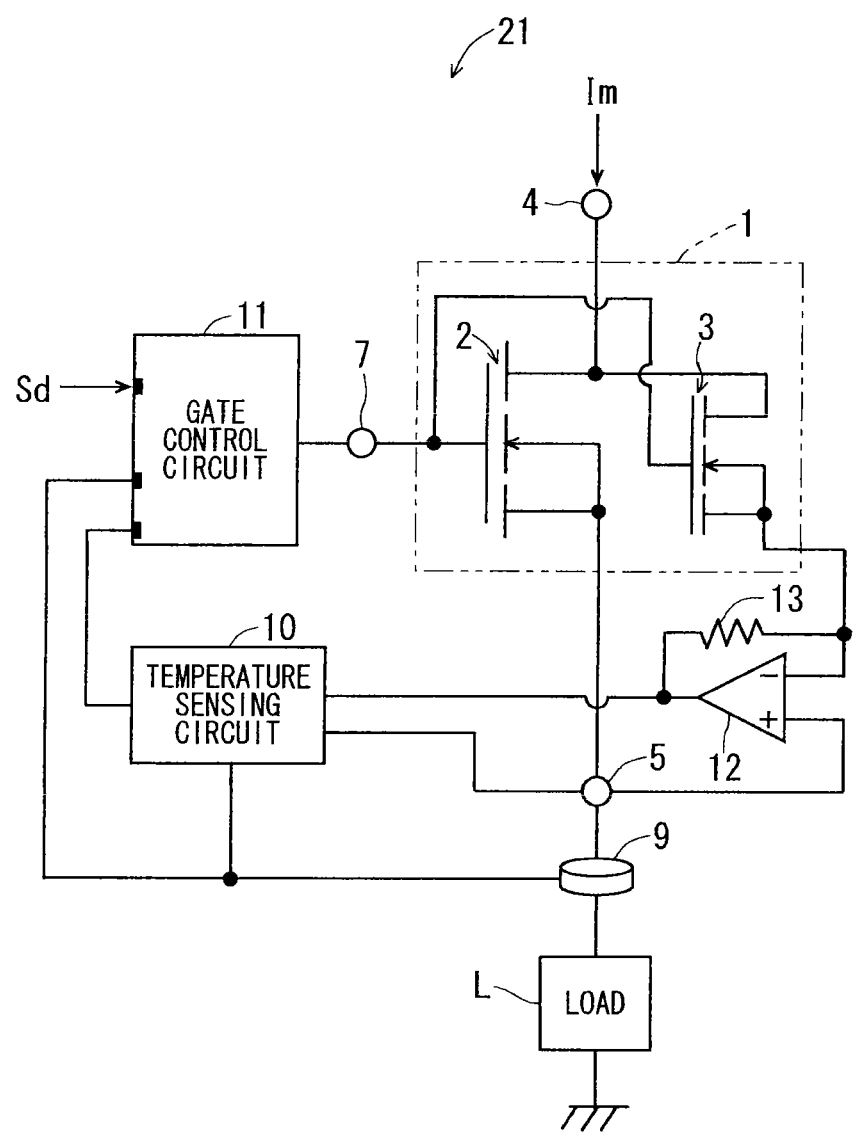

F I G . 1 1
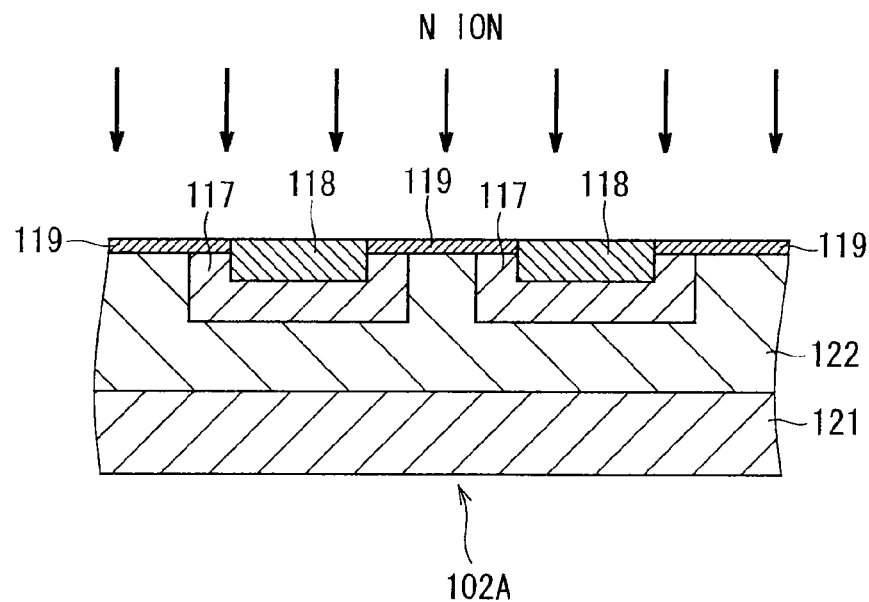
F I G . 1 2
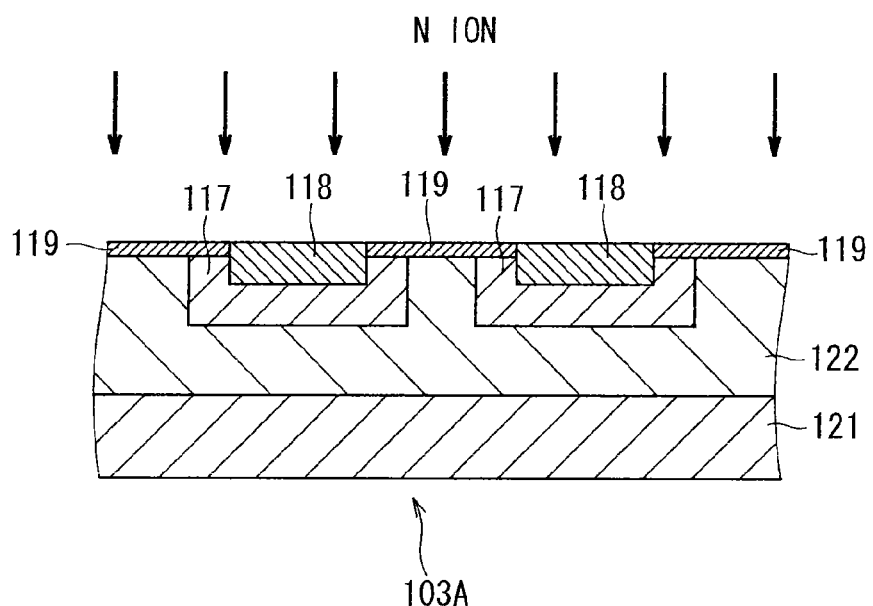

F I G . 1 7
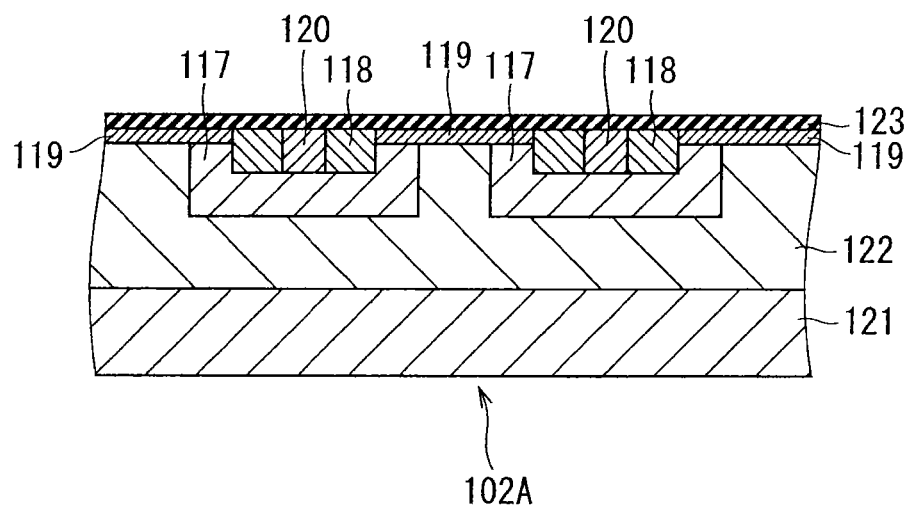
F I G . 1 8
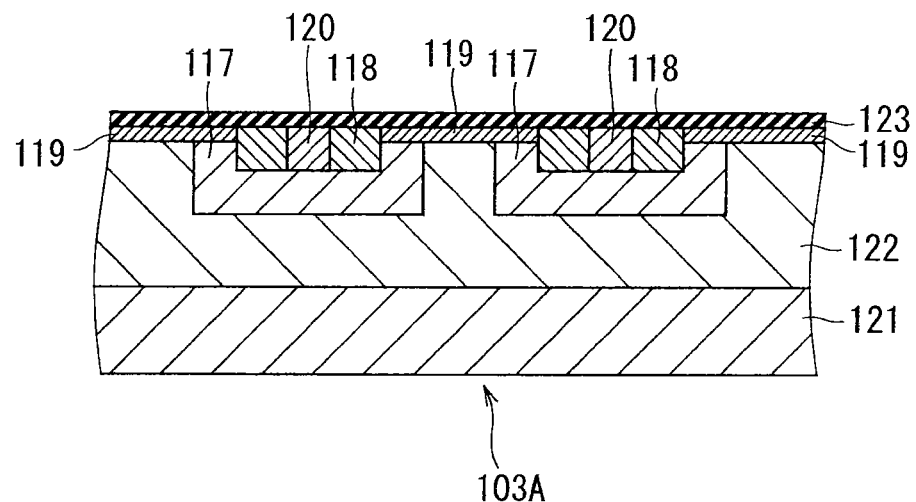

F I G . 2 9
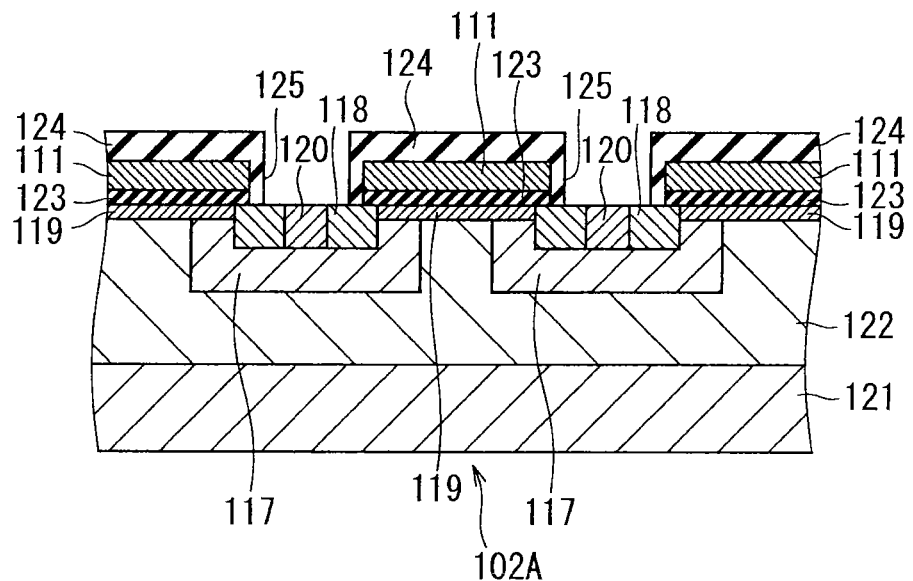
F I G . 3 0
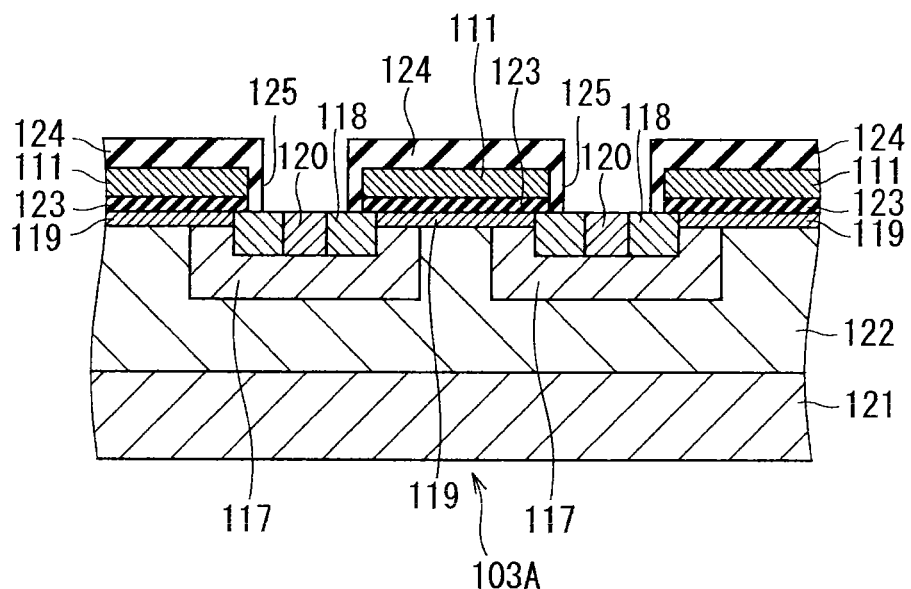

F I G . 3 3
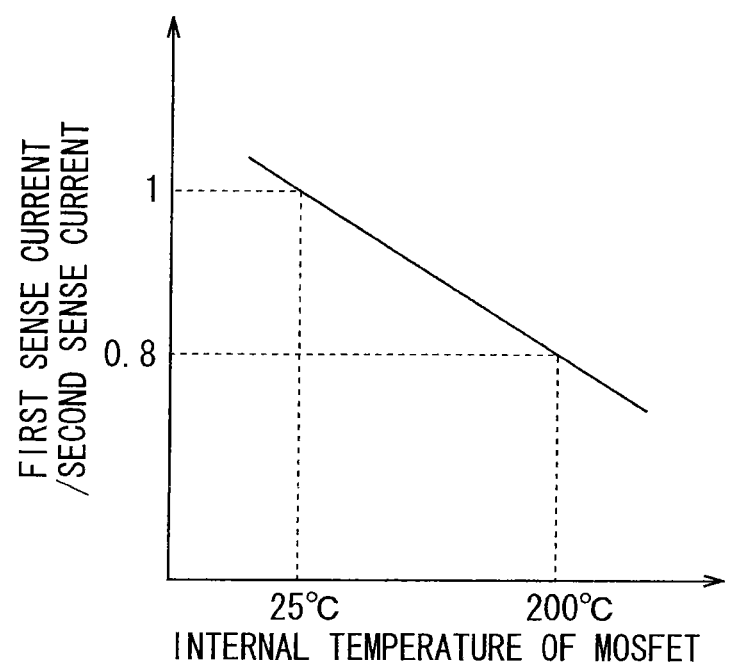

SEMICONDUCTOR DEVICE

CROSS-REFERENCE TO RELATED APPLICATION(S)

This application is a National Stage of PCT/JP11/69298, filed Aug. 26, 2011, which claims priority to Japanese applications JP 2010-197597, filed Sep. 3, 2010, and JP 2010-197384 filed Sep. 3, 2010.

TECHNICAL FIELD

The present invention relates to a semiconductor device, and more particularly, to a semiconductor device having a function of sensing the information regarding the temperature of a semiconductor transistor contained therein.

BACKGROUND ART

A current of several tens of A to several hundreds of A flows through a semiconductor transistor for use in a power converter or the like, which causes large heat generation and leads to a temperature rise of the semiconductor transistor. The temperature rise of the semiconductor transistor is suppressed by a cooling device. In some cases, however, a temperature rise of the semiconductor transistor cannot be suppressed sufficiently.

For example, in a short-circuit failure that might happen in a power converter circuit or the like, a current flowing through a semiconductor transistor increases abruptly, which causes an over-current. When an over-current occurs in a semiconductor transistor due to, for example, a short-circuit, heat generation is caused abruptly, whereby the temperature of the semiconductor transistor rises abruptly. In an over-temperature state as a result of an abrupt temperature rise, the semiconductor transistor cannot be controlled and are broken down in some cases. In such cases, the power converter circuit may be severely affected at times.

In order to prevent a breakdown of a semiconductor transistor due to an abrupt temperature rise, it is required to rapidly and accurately sense a temperature of a semiconductor transistor or a current flowing through the semiconductor transistor and control the semiconductor transistor, to thereby protect the semiconductor transistor from an over-temperature state.

For example, Patent Document 1 (page 10, FIG. 3) and Patent Document 2 (pages 5 and 6, FIG. 1) disclose semiconductor devices each containing an element for sensing a temperature (hereinafter, also referred to as a "temperature sensing element" in some cases) as a semiconductor device of the conventional art that can sense the temperature of a semiconductor transistor (hereinafter, merely referred to as a "transistor" at times).

In the semiconductor devices disclosed in Patent Documents 1 and 2, a diode, resistor, or the like is provided as a temperature sensing element on a transistor or in the vicinity thereof, and the temperature of the transistor is sensed from the temperature dependence in characteristics of the temperature sensing element. For example, in the semiconductor device disclosed in Patent Document 2, the temperature of the transistor is sensed from the temperature dependence of a PN diode being a temperature sensing element that is formed on a substrate of a wide bandgap semiconductor such as a silicon carbide.

As a semiconductor device of the conventional art that can sense the current flowing through a semiconductor transistor, for example, Non-Patent Document 1 (page 768, FIG. 6) and Patent Document 3 (page 4, FIG. 1) disclose semiconductor devices each containing an element for sensing a current (hereinafter, referred to as a "current sensing element" at times).

In the semiconductor devices disclosed in Non-Patent Document 1 and Patent Document 3, a part of a plurality of cells constituting a transistor is used as a current sensing element. For example, in the semiconductor device described in Patent Document 3, a part of a plurality of cells constituting a semiconductor transistor is provided, as a current sensing cell, in the vicinities of the center and outer periphery of a semiconductor chip, and the current flowing through the semiconductor chip is sensed based on an average value of the sense currents sensed by the current sensing cell.

In the semiconductor devices disclosed in Non-Patent Document 1 and Patent Document 3, a transistor includes a group of partial cells (hereinafter, referred to as a "sense cell group") that is used as a current sensing element and a group of cells (hereinafter, referred to as a "main cell group") that carriers most of the current conducted to the transistor. The technologies disclosed in Non-Patent Document 1 and Patent Document 3 are adopted as the technology of sensing the current flowing through the transistor also in, for example, the semiconductor device disclosed in Patent Document 1 above.

PRIOR ART DOCUMENTS

Patent Documents

Patent Document 1: Japanese Patent Application Laid-Open No. 2004-117111
Patent Document 2: Japanese Patent Application Laid-Open No. 2005-175357
Patent Document 3: Japanese Patent Application Laid-Open No. 2005-322781

Non-Patent Document

Non-Patent Document 1: Y. Xiao and three others, "Current Sensing Trench Power MOSFET for Automotive Applications", Applied Power Electronics Conference and Exposition, IEEE, 2005, vol. 2, pp. 766-770

DISCLOSURE OF INVENTION

Problems to be Solved by the Invention

As disclosed in Patent Documents 1 and 2 above, examples of the semiconductor device of the conventional art that can sense the temperature of a semiconductor transistor include a semiconductor device that senses the temperature of a transistor from the temperature dependence in characteristics of a temperature sensing element such as a diode or resistor provided on a transistor or in the vicinity thereof. In this semiconductor device, a spatial distance exists between an inside of a transistor that is a heat generating part and a temperature sensing part in which a temperature sensing element such as a diode or resistor is provided. This makes it difficult to rapidly and accurately sense the internal temperature of the transistor, causing a problem that a breakdown of a transistor due to an abrupt temperature rise is difficult to prevent.

For example, in the semiconductor device disclosed in Patent Document 1, a spatial distance exists between a diode used for temperature sensing (hereinafter, referred to as a "temperature sensing diode" at times) and an inside of a transistor being a heat generating part (hereinafter, referred to as a "transistor heat-generating part" at times), which generates a temperature difference between the temperature sensing diode and the transistor heat-generating part. In order to eliminate this temperature difference, in the semiconductor device disclosed in Patent Document 1, the temperature sensed by the temperature sensing diode is corrected with a value of a sense current flowing from a current sensing emitter.

However, the spatial distance between the temperature sensing diode and the transistor heat-generating part is not eliminated. Therefore, the semiconductor device disclosed in Patent Document 1 has a problem that it is difficult to promptly sense an accurate temperature upon an abrupt temperature rise of the transistor heat-generating part.

In the semiconductor device disclosed in Non-Patent Document 1 above, a sense cell group that is a group of partial cells constituting a transistor is used as a current sensing element. The use of the sense cell group as a temperature sensing element solves the problem of a spatial distance between the portion that senses a temperature and a heat generating part. However, the sense cell group is aimed to accurately sense the current flowing through the transistor in the first place, and thus is desired to show the same characteristics as those of the main cell group. Accordingly, even if the technology disclosed in Non-Patent Document 1 is applied per se, it is difficult to rapidly and accurately sense an abrupt temperature rise inside a transistor.

In the semiconductor device disclosed in Patent Document 2 above, a PN diode for temperature sensing is formed on an insulating film, and thus, it takes time to sense the accurate temperature of a semiconductor transistor through which a current flows. Accordingly, a slight delay occurs between a temperature rise of the semiconductor transistor and sensing of the temperature rise by the PN diode for temperature sensing. This may delay the protection from an over-temperature state, whereby the semiconductor transistor may be broken down.

The semiconductor device disclosed in Patent Document 2 is manufactured as follows. First, regions such as a drain region constituting a semiconductor transistor are formed on a semiconductor substrate, an insulating film is formed on the semiconductor substrate, and then, a polycrystalline semiconductor is deposited on the insulating film. Then, ion implantation is performed partially with masks for forming a PN diode for temperature sensing. Then, a polycrystalline semiconductor layer is patterned, to thereby form a gate electrode of the semiconductor transistor and the PN diode for temperature sensing. Finally, a source electrode and the like are formed, to thereby obtain a semiconductor device.

As described above, in the semiconductor device disclosed in Patent Document 2, the number of steps in manufacturing (hereinafter, referred to as the "number of manufacturing steps" at times) increases for forming the PN diode for temperature sensing, causing a problem of an increase in manufacturing cost.

Patent Documents 1 to 3 and Non-Patent Document 1 do not disclose a semiconductor device containing a temperature sensing element as well as a current sensing element. In order to achieve a semiconductor device containing a temperature sensing element as well as a current sensing element, it is conceivable to combine, for example, the technology described in Patent Document 2 and the technology described in Patent Document 3. In this case, an anode electrode and a cathode electrode of a temperature sensing diode and a source electrode of a current sensing cell need to be formed on a semiconductor transistor, which may result in a reduced effective area of the semiconductor transistor.

An object of the present invention is to provide a semiconductor device capable of rapidly and accurately sensing the information regarding the temperature of a semiconductor transistor contained therein.

Means for Solving the Problems

A semiconductor device according to the present invention includes a semiconductor transistor being composed of a plurality of cells, and a sensor circuit sensing temperature information regarding the temperature of the semiconductor transistor, wherein the semiconductor transistor includes a main cell group including a cell for supplying a current to a load among the plurality of cells, and a sense cell group including a cell for sensing the temperature information thereamong, the main cell group and the sense cell group have different temperature characteristics showing changes in electrical characteristics to changes in temperature of the semiconductor transistor, and the sensor circuit senses the temperature information based on a value of a main current flowing through the main cell group, and a value of a sense current flowing through the sense cell group, Further, the semiconductor device of the present invention includes a semiconductor transistor being composed of a plurality of cells, and a sensor circuit sensing temperature information regarding the temperature of the semiconductor transistor, wherein the semiconductor transistor includes a main cell group including a cell for supplying a current to a load among the plurality of cells, a sense cell group including a cell for sensing the temperature information thereamong, and another sense cell group including at least a part of the cells other than the cells included in the main cell group and the sense cell group thereamong, the another sense cell group being used for sensing the temperature information, the main cell group and the sense cell group have different temperature characteristics showing changes in electrical characteristics to changes in temperature of the semiconductor transistor, the sense cell group and the another sense cell group have different temperature characteristics showing changes in electrical characteristics to changes in temperature of the semiconductor transistor, and the sensor circuit senses the temperature information based on a value of a sense current flowing through the sense cell group and a value of another sense current flowing through the another sense cell group.

Effects of the Invention

According to the semiconductor device of the present invention, the semiconductor transistor is composed of a plurality of cells and includes a main cell group including a cell for supplying a current to a load among the plurality of cells, and a sense cell group including a cell for sensing the temperature information regarding the temperature of the semiconductor transistor thereamong. The main cell group and the sense cell group have different temperature characteristics showing changes in electrical characteristics to changes in temperature of the semiconductor transistor. The sensor circuit senses the temperature information of the semiconductor transistor based on the value of the main current flowing through the main cell group and the value of the sense current flowing through the sense cell group.

The main cell group and the sense cell group are incorporated in the same semiconductor transistor though they have different temperature characteristics, and thus show the same temperature. The main cell group and the sense cell group show the same temperature as described above, and thus, a difference in temperature characteristics between the main cell group and the sense cell group appears as a difference between the value of the main current flowing through the main cell group and the value of the sense current flowing through the sense cell group. Therefore, the sensor circuit senses the temperature information of the semiconductor transistor based on the value of the main current and the value of the sense current, whereby the temperature information of the semiconductor transistor can be sensed rapidly and accurately. The temperature information of the semiconductor transistor is, for example, the temperature of the semiconductor transistor or the value of the main current and the value of the sense current.

Further, according to the semiconductor device of the present invention, the semiconductor transistor is composed of a plurality of cells, and includes a main cell group including a cell for supplying a current to a load among the plurality of cells, a sense cell group including a cell for sensing the temperature information of the semiconductor transistor thereamong, and another sense cell group including at least a part of the cells other than the cells included in the main cell group and the sense cell group thereamong, the another sense cell group being used for sensing the temperature information of the semiconductor transistor. The main cell group and the sense cell group have different temperature characteristics. The sense cell group and the another sense cell group have different temperature characteristics. The sensor circuit senses the temperature information of the semiconductor transistor based on a value of a sense current flowing through the sense cell group and a value of another sense current flowing through the another sense cell group.

The sense cell group and the another sense cell group are incorporated in the same semiconductor transistor though they have different temperature characteristics, and thus show the same temperature. The sense cell group and the another sense cell group show the same temperature as described above, and thus, a difference in temperature characteristics between the sense cell group and the another sense cell group appears as a difference between the value of the sense current flowing through the sense cell group and the value of the another sense current flowing through the another sense cell group. Therefore, the sensor circuit senses the temperature information of the semiconductor transistor based on the value of the sense current and the value of the another sense current, whereby the temperature information of the semiconductor transistor can be sensed rapidly and accurately.

These and other objects, features, aspects, and advantages of the present invention will become more apparent from the following detailed description of the present invention when taken in conjunction with the accompanying drawings.

BRIEF DESCRIPTION OF DRAWINGS

FIG. 1 is an electrical circuit diagram showing the configuration of a semiconductor device 20 according to a first embodiment of the present invention.

FIG. 3 is an electrical circuit diagram showing the configuration of a semiconductor device 21 according to a second embodiment of the present invention.

FIG. 11 is a cross-sectional view showing a state of a main cell group formation region 102A at a stage when the formation of a channel region 119 was finished.

FIG. 12 is a cross-sectional view showing a state of a first sense cell group formation region 103A at the stage when the formation of the channel region 119 was finished.

FIG. 17 is a cross-sectional view showing a state of the main cell group formation region 102A at a stage when the formation of a gate insulating film 123 was finished.

FIG. 18 is a cross-sectional view showing a state of the first sense cell group formation region 103A at the stage when the formation of the gate insulating film 123 was finished.

FIG. 29 is a cross-sectional view showing a state of the main cell group formation region 102A at a stage when the formation of a source contact hole 125 and a gate contact hole 126 was finished.

FIG. 30 is a cross-sectional view showing a state of the first sense cell group formation region 103A at the stage when the formation of the source contact hole 125 and the gate contact hole 126 was finished.

FIG. 33 is a graph showing an example of the temperature dependence of a ratio between a first sense current and a second sense current during an operation of a MOSFET 101.

EMBODIMENTS FOR CARRYING OUT THE INVENTION

First Embodiment

Figure 2:
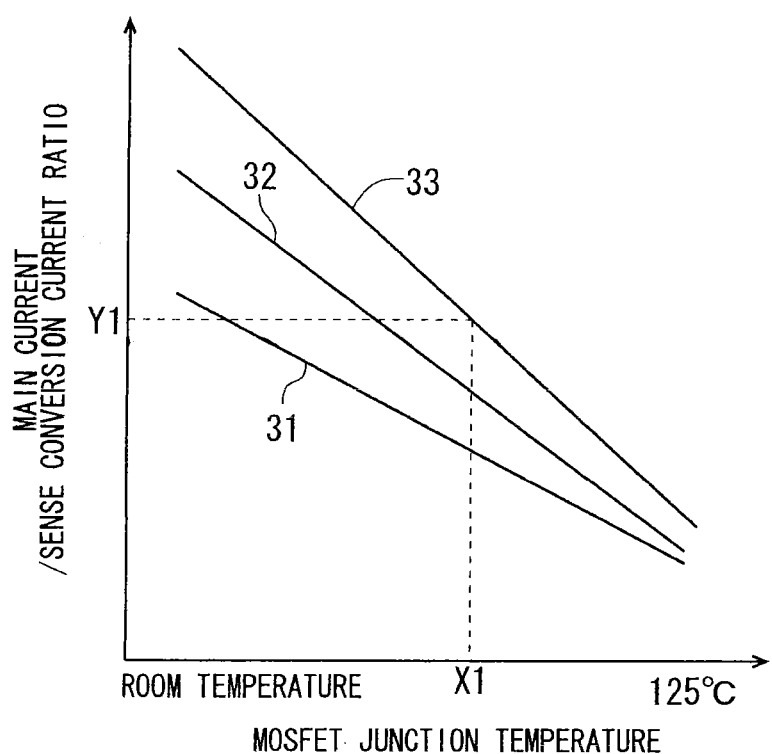
FIG. 2 is a graph showing the relationship between a junction temperature of a MOSFET 1 and a main current/sense conversion current ratio.

FIG. 1 is an electrical circuit diagram showing the configuration of a semiconductor device 20 according to a first embodiment of the present invention. The semiconductor device 20 of the present embodiment has a function of sensing temperature information that is the information regarding the temperature of a semiconductor transistor contained therein. More specifically, the semiconductor device 20 of the present embodiment has a function of sensing the temperature information of the semiconductor transistor contained therein to control the semiconductor transistor. The temperature information of a semiconductor transistor is, for example, the temperature of a semiconductor transistor or a value of a main current and a value of a sense current.

In the present embodiment, the semiconductor device 20 senses the temperature of the semiconductor transistor, specifically, the internal temperature of the semiconductor transistor as the temperature information of the semiconductor transistor. The present embodiment adopts the configuration described below for the sake of providing the semiconductor device 20 capable of rapidly and accurately sensing an abrupt temperature rise inside the semiconductor transistor to rapidly control the semiconductor transistor.

The semiconductor device 20 includes a metal oxide semiconductor field effect transistor (abbreviated as MOSFET) 1 being a semiconductor transistor, a drain terminal 4, a source terminal 5, a sense terminal 6, a gate terminal 7, a sense resistor 8, a Hall current sensor 9, a temperature sensing circuit 10, and a gate control circuit 11. The semiconductor device 20 is connected to a load L and supplies power to the load L. The temperature sensing circuit 10 corresponds to a sensor circuit. The gate control circuit 11 corresponds to a control circuit.

The MOSFET 1 is composed of a main cell group 2 and a sense cell group 3. More specifically, the MOSFET 1 is composed of a plurality of cells. The plurality of cells are formed on the same substrate and are connected in parallel. The main cell group 2 includes the cell for supplying a current to the load L among the plurality of cells constituting the MOSFET 1. The sense cell group 3 includes the cell for sensing the temperature information of the MOSFET 1 among the plurality of cells constituting the MOSFET 1.

While FIG. 1 shows the case in which one cell constituting the main cell group 2 and one cell constituting the sense cell group 3 are connected in parallel for easy understanding, in actuality, the main cell group 2 and the sense cell group 3 each include a plurality of cells, and the plurality of cells are connected in parallel. One or a plurality of cells may be included in the sense cell group 3.

The main cell group 2 needs to supply a current sufficient for driving the load L to the load L, and thus includes a larger number of cells compared with the sense cell group 3. The sense cell group 3 is provided for sensing the temperature information, specifically, the temperature of the MOSFET 1, and merely needs to obtain a current sufficient for sensing the temperature. Therefore, the sense cell group 3 includes fewer cells compared with the main cell group 2.

Accordingly, a relatively large current flows through the main cell group 2, whereas a relatively small current flows through the sense cell group 3. The ratio between the number of cells included in the main cell group 2 (hereinafter, referred to as the "number of main cells" at times) and the number of cells included in the sense cell group 3 (hereinafter, referred to as the "number of sense cells" at times) is, for example, 1,000:1. The ratio between the number of main cells and the number of sense cells is not limited thereto.

The main cell group 2 and the sense cell group 3 differ in temperature characteristics. More specifically, the cell constituting the main cell group 2 and the cell constituting the sense cell group 3 differ in temperature characteristics. The temperature characteristics show changes in electrical characteristics to changes in temperature of the MOSFET 1, specifically, junction temperature of the MOSFET 1. The electrical characteristics are, for example, a threshold voltage and current-voltage characteristics showing the relationship between a drain current and a drain voltage. Here, the junction temperature of the MOSFET 1 refers to the internal temperature of the MOSFET 1 when the MOSFET 1 generates heat by energization and a switching operation.

The plurality of cells constituting the MOSFET 1 each include a drain electrode, a source electrode, and a gate electrode. The drain electrode of the cell constituting the main cell group 2 (hereinafter, referred to as a "drain electrode of the main cell group 2" at times) and the drain electrode of the cell constituting the sense cell group 3 (hereinafter, referred to as a "drain electrode of the sense cell group 3" at times) are electrically connected and are connected to the drain terminal 4 common thereto. The drain terminal 4 is connected to, for example, a power source (not shown).

The gate electrode of the cell constituting the main cell group 2 (hereinafter, referred to as a "gate electrode of the main cell group 2" at times) and the gate electrode of the cell constituting the sense cell group 3 (hereinafter, referred to as a "gate electrode of the sense cell group 3" at time) are electrically connected and are connected to the gate terminal 7 common thereto. The source electrode of the cell constituting the main cell group 2 (hereinafter, referred to as a "source electrode of the main cell group 2") is connected to the source terminal 5. The source electrode of the cell constituting the sense cell group 3 (referred to as a "source electrode of the sense cell group 3" at times) is connected to the sense terminal 6. The source terminal 5 and the sense terminal 6 are electrically connected via the sense resistor 8.

The source terminal 5 is connected to the load L. The load L is connected to the ground. That is, the source terminal 5 is connected to the ground via the load L. The load L is, for example, a motor.

The Hall current sensor 9 is connected to the temperature sensing circuit 10 and the gate control circuit 11. The source terminal 5 and the sense terminal 6 are each connected to the temperature sensing circuit 10. The temperature sensing circuit 10 and the gate control circuit 11 are connected to each other. The gate control circuit 11 is connected to the gate terminal 7.

The Hall current sensor 9 senses a current Im flowing through the main cell group 2 (hereinafter, referred to as a "main current" at times), specifically, the drain current Im flowing from the drain terminal 4 to the source terminal 5 through the main cell group 2. The value of the main current Im is the total of values of the currents flowing through all cells included in the main cell group 2. A main current signal including the value of the main current Im (hereinafter, referred to as a "main current value" at times) sensed by the Hall current sensor 9 is supplied from the Hall current sensor 9 to the temperature sensing circuit 10 and the gate control circuit 11. The Hall current sensor 9 corresponds to main current information sensing means, and the main current value corresponds to the main current information regarding the main current.

The temperature sensing circuit 10 obtains a value of the current flowing through the sense cell group 3 (hereinafter, referred to as a "sense current" at times) based on a voltage drop value of the sense resistor 8 connected between the sense terminal 6 and the source terminal 5. The voltage drop value of the sense resistor 8 corresponds to the sense current information regarding the sense current, and the source terminal 5, the sense terminal 6, and the sense resistor 8 correspond to sense current information sensing means.

The temperature sensing circuit 10 senses the temperature of the MOSFET 1 based on the value of the sense current (hereinafter, referred to as a "sense current value" at times) that is obtained based on the voltage drop value of the sense resistor 8. More specifically, the temperature sensing circuit 10 senses the temperature of the MOSFET 1 based on the main current value, which is included in the main current signal supplied from the Hall current sensor 9, and the sense current value, which is obtained based on the voltage drop value of the sense resistor 8. Specifically, the temperature of the MOSFET 1 is the junction temperature of the MOSFET 1. A junction temperature signal including the junction temperature of the MOSFET 1 that is sensed by the temperature sensing circuit 10 is supplied from the temperature sensing circuit 10 to the gate control circuit 11.

The gate control circuit 11 controls the MOSFET 1 based on a drive signal Sd supplied from the outside. Specifically, the gate control circuit 11 supplies a drive signal including a gate voltage for driving the MOSFET 1 to the gate terminal 7 based on the drive signal Sd supplied from the outside, to thereby drive the MOSFET 1. The MOSFET 1 operates based on the gate voltage included in the drive signal supplied from the gate control circuit 11 via the gate terminal 7. The MOSFET 1 turns on in this manner, whereby the current supplied from the power source (not shown) via the drain terminal 4 flows through the main cell group 2 and flows through the load L via the source terminal 5. This enables to drive the load L.

Also, the gate control circuit 11 controls the MOSFET 1 based on the junction temperature of the MOSFET 1 that is included in the junction temperature signal sensed by the temperature sensing circuit 10 and supplied from the temperature sensing circuit 10. Specifically, the gate control circuit 11 compares the junction temperature included in the junction temperature signal that is supplied from the temperature sensing circuit 10 with a predetermined junction temperature threshold and, in a case where the junction temperature exceeds the junction temperature threshold, supplies an interruption signal for interrupting the operation of the MOSFET 1 to the gate terminal 7. The gate terminal 7 is supplied with the interruption signal, whereby the operation of the MOSFET 1 is interrupted.

Also, the gate control circuit 11 controls the MOSFET 1 based on a main current value included in the main current signal supplied from the Hall current sensor 9. Specifically, the gate control circuit 11 compares the main current value included in the main current signal supplied from the Hall current sensor 9 with a predetermined main current threshold and, in a case where the main current value exceeds the main current threshold, supplies the interruption signal for interrupting the operation of the MOSFET 1 to the gate terminal 7. The gate terminal 7 is supplied with the interruption signal, whereby the operation of the MOSFET 1 is interrupted.

In a case where the junction temperature is equal to or lower than the junction temperature threshold or in a case where the main current value is equal to or smaller than the main current value threshold, the gate terminal 7 is not supplied with the interruption signal. Accordingly, the MOSFET 1 operates based on the gate voltage.

The junction temperature of the MOSFET 1 can be sensed by the temperature sensing circuit 10 owing to the fact that the temperature characteristics of the main cell group 2 and the temperature characteristics of the sense cell group 3 differ from each other. That is, if the temperature characteristics of the main cell group 2 and the temperature characteristics of the sense cell group 3 are varied from each other, the temperature sensing circuit 10 can sense the junction temperature of the MOSFET 1.

The main cell group 2 and sense cell group 3 having different temperature characteristics are formed by, for example, varying channel structures. Specifically, the main cell group 2 and sense cell group 3 having different temperature characteristics are formed by varying the impurity concentration (hereinafter, referred to as a "dopant concentration" at times) of a channel region forming the MOSFET 1. That is, the dopant concentration in the channel region of the sense cell group 3 is varied from the dopant concentration in the channel region of the main cell group 2, so that the main cell group 2 and sense cell group 3 having different temperature characteristics can be formed.

This method can be performed by, for example, varying the dopant concentration of the channel region to differ the rate of temperature change of a threshold voltage Vth (see Reference 1).

Reference 1: S. M. Sze, "Physics of Semiconductor Devices, 2nd Edition", John Wiley & Sons, 1981, pp. 451-453.

In the present embodiment, the main cell group 2 and the sense cell group 3 have different channel structures, and thus have different threshold voltages. In the present embodiment, the sense cell group 3 is set to have a higher threshold voltage than that of the main cell group 2. Specifically, the threshold voltage of the sense cell group 3 is set to be higher than the threshold voltage of the main cell group 2 by approximately 1.6 V to 1.8 V.

Next, the principle of sensing the junction temperature of the MOSFET 1 is described. FIG. 2 is a graph showing the relationship between the junction temperature of the MOSFET 1 and the main current/sense conversion current ratio. In FIG. 2, the horizontal axis represents the junction temperature of the MOSFET 1 (hereinafter, referred to as the "MOSFET junction temperature" at times), and the vertical axis represents the main current/sense conversion current ratio. The main cell group 2 and the sense cell group 3 are both incorporated in the MOSFET 1 that is the same transistor, and thus show the same junction temperature. Therefore, the MOSFET junction temperature of the horizontal axis in FIG. 2 represents the junction temperatures of the main cell group 2 and the sense cell group 3. The main current/sense conversion current ratio of the vertical axis in FIG. 2 represents the ratio of the main current Im to the sense conversion current, that is, a value obtained by dividing the main current value being a value of the main current Im by a value of the sense conversion current.

Here, the sense conversion current is obtained by Expression (1) below.

(sense conversion current)=(voltage drop value of sense resistor)×(number of main cells)÷(number of sense cells)÷(value of sense resistor)  (1)

In Expression (1), the voltage drop value of sense resistor is a voltage drop value of the sense resistor 8, the number of main cells is the number of cells included in the main cell group 2, the number of sense cells is the number of cells included in the sense cell group 3, and the value of sense resistor is a resistance value of the sense resistor 8. The number of main cells, the number of sense cells, and the value of sense resistor in Expression (1) are constants, which are values that can be set by a designer.

In the right side of Expression (1), the value obtained by dividing the "voltage drop value of sense resistor" by the "value of sense resistor" corresponds to a sense current value. The value obtained by dividing the sense current value by the "number of sense cells" corresponds to a sense current value per cell. The resultant obtained by multiplying the sense current value per cell by the "number of main cells" is a value of the "sense conversion current" expressed by Expression (1). That is, the value of the "sense conversion current" expressed by Expression (1) is a main current value calculated based on the measured value of the sense current. Therefore, the above-mentioned "main current/sense conversion current ratio" represents the percentage of the measured main current value to the main current value calculated based on the sense current value.

FIG. 2 shows the characteristics in cases where the main current value is 30 A, 50 A, and 70 A as representatives. The case where the main current value is 30 A is indicated by symbol "31", the case where the main current value is 50 A is indicated by symbol "32", and the case where the main current value is 70 A is indicated by symbol "33". In FIG. 2, the junction temperature at the left end of each graph on the sheet is equal to a room temperature, for example, 25° C., and the junction temperature at the right end thereof is 125° C.

FIG. 2 reveals that if the main current Im is constant, the junction temperature of the MOSFET 1 can be determined uniquely from the main current/sense conversion current ratio. That is, the junction temperature of the MOSFET 1 can be sensed uniquely if the main current/sense conversion current ratio and the main current value on that occasion are known. Therefore, specifically, the temperature sensing circuit 10 obtains the junction temperature of the MOSFET 1 based on the main current/sense conversion current ratio and the main current value on that occasion.

The main current/sense conversion current ratio and the main current value on that occasion can be obtained from the voltage drop value of the sense resistor 8 and the value sensed by the Hall current sensor 9 (hereinafter, referred to as a "sensed value of the Hall current sensor 9" at times). Therefore, more specifically, the temperature sensing circuit 10 obtains the main current/sense conversion current ratio based on the voltage drop value of the sense resistor 8 and the main current value that is a sensed value of the Hall current sensor 9, and obtains the junction temperature of the MOSFET 1 based on the obtained main current/sense conversion current ratio and the main current value. For example, if the main current/sense conversion current ratio obtained from the voltage drop value of the sense resistor 8 and the sensed value of the Hall current sensor 9 is Y1 and the main current value is 70 A, the junction temperature of the MOSFET 1 is X1° C.

While FIG. 2 shows the characteristics in the cases of 30 A, 50 A, and 70 A as examples of the main current value, the junction temperature of the MOSFET 1 can be obtained also in cases of main current values other than the above. For example, the main current/sense conversion current ratio increases monotonously along with an increase of the main current Im to a constant junction temperature. Accordingly, an accurate junction temperature can be sensed by matrixing the graph shown in FIG. 2 with desired temperature resolution and main current/sense conversion current ratio resolution and allocating main current values obtained from the experiment to elements of a matrix.

For example, the temperature sensing circuit 10 pre-stores, in a memory (not shown) contained in the temperature sensing circuit 10, a table in which the main current value, the main current/sense conversion current ratio, and the junction temperature of the MOSFET 1 are matrixed, to thereby derive the junction temperature of the MOSFET 1 with reference to the matrixed table by an integrated circuit (IC) in the temperature sensing circuit 10. The memory for storing the matrixed table may be provided outside the temperature sensing circuit 10. The matrixed table shows the relationship among the main current value, the sense current value, and the temperature of the MOSFET 1, which corresponds to the related information. Hereinafter, the "related information" is referred to as "temperature related information" at times.

As described above, the temperature sensing circuit 10 obtains the temperature related information such as a matrixed table in advance by, for example, reading from the memory. Then, the temperature sensing circuit 10 obtains a main current value from the main current signal supplied from the Hall current sensor 9 and obtains a sense current value based on the voltage drop values of the sense resistor 8 supplied from the source terminal 5 and the sense terminal 6. The temperature sensing circuit 10 senses the temperature of the MOSFET 1, specifically, the junction temperature of the MOSFET 1 based on the obtained main current value and sense current value and the temperature related information such as a matrixed table.

As described above, in the semiconductor device 20 of the present embodiment, the temperature sensing circuit 10 senses the junction temperature of the MOSFET 1 based on the sense current value that is a value of the sense current flowing through the sense cell group 3. Specifically, the temperature sensing circuit 10 senses the junction temperature of the MOSFET 1 based on the main current value that is the value of the main current Im flowing through the main cell group 2 and the sense current value that is the value of the sense current flowing through the sense cell group 3.

The main cell group 2 and the sense cell group 3 have different temperature characteristics but are incorporated in the MOSFET 1 that is the same transistor, and thus show the same junction temperature. The main cell group 2 and the sense cell group 3 show the same junction temperature in this manner, and accordingly, a difference in temperature characteristics between the main cell group 2 and the sense cell group 3 appears as a difference between a main current value and a sense current value.

Accordingly, as described above, the temperature sensing circuit 10 senses the junction temperature of the MOSFET 1 based on the sense current value, specifically, senses the junction temperature of the MOSFET 1 based on the main current value and the sense current value, which enables to rapidly and accurately sense the junction temperature of the MOSFET 1.

The sense current used for sensing the junction temperature by the temperature sensing circuit 10 flows inside the same transistor as that of the main cell group 2, whose junction temperature needs to be sensed, which reflects a rise in junction temperature of the main cell group 2 without delay. In other words, the value of the sense current is a current value without signal delay to the rise in junction temperature, that is, without temperature signal delay. The temperature sensing circuit 10 obtains the junction temperature of the MOSFET 1 from the current value without temperature signal delay. Therefore, also in a case where an abrupt temperature rises occurs inside the MOSFET 1, the abrupt temperature rise inside the MOSFET 1 can be sensed rapidly and accurately.

The gate control circuit 11 controls the MOSFET 1 based on the junction temperature of the MOSFET 1 that is sensed rapidly and accurately as described above, which enables to control the MOSFET 1 rapidly. For example, in a case where the temperature rises abruptly inside the MOSFET 1, the gate control circuit 11 supplies an interruption signal to the gate terminal 7 to interrupt the operation of the MOSFET 1 rapidly, which enables to prevent a breakdown of the MOSFET 1 due to an abrupt temperature rise.

In the present embodiment, if the junction temperature of the MOSFET 1 that is sensed by the temperature sensing circuit 10 as described above exceeds the junction temperature threshold, the gate control circuit 11 supplies an interruption signal to the gate terminal 7 to interrupt the operation of the MOSFET 1. This prevents a breakdown of the MOSFET 1 due to a temperature rise, and accordingly, the MOSFET 1 is protected. In the present embodiment, as described above, the temperature sensing circuit 10 and the gate control circuit 11 function as a temperature sense and protection circuit.

Also, in the present embodiment, the semiconductor device 20 includes the Hall current sensor 9 corresponding to main current information sensing means, and the source terminal 5, sense terminal 6, and sense resistor 8 corresponding to sense current information sensing means. The temperature sensing circuit 10 obtains the temperature related information such as a matrixed table in advance, to thereby obtain a main current value from a main current signal supplied from the Hall current sensor 9 and obtain a sense current value based on the voltage drop value of the sense resistor 8 supplied from the source terminal 5 and the sense terminal 6. Then, the temperature sensing circuit 10 senses the temperature of the MOSFET 1, specifically, the junction temperature of the MOSFET 1, based on the obtained main current value and sense current value and the temperature related information such as a matrixed table. The configuration as described above enables to achieve the temperature sensing circuit 10 capable of sensing the junction temperature of the MOSFET 1.

Also, in the present embodiment, the main cell group 2 and the sense cell group 3 have different channel structures. Specifically, the impurity concentration of the channel region constituting the MOSFET 1 differs between the main cell group 2 and the sense cell group 3. The configuration as describe above enables to achieve the main cell group 2 and sense cell group 3 having different temperature characteristics.

It suffices that as to a difference in temperature characteristics between the main cell group 2 and the sense cell group 3, for example, the main current/sense conversion current ratio has a rate of change of 0.1[%/K] or higher to the MOSFET junction temperature, regarding a plot of the main current/sense conversion current ratio and the MOSFET junction temperature shown in FIG. 2 described above.

Also, in the present embodiment, the sense cell group 3 is set to have a higher threshold voltage that that of the main cell group 2. Therefore, during a switching operation of the MOSFET 1, the sense cell group 3 turns on more slowly than the main cell group 2 and turns off faster than the main cell group 2. This mitigates noise in switching, whereby the temperature information of the MOSFET 1, for example, the temperature of the MOSFET 1 can be sensed accurately. Therefore, for example, false sensing of over-temperature of the MOSFET 1 can be prevented.

Second Embodiment

FIG. 3 is an electrical circuit diagram showing the configuration of a semiconductor device 21 according to a second embodiment of the present invention. The semiconductor device 21 of the present embodiment is similar in configuration to the semiconductor device 20 of the first embodiment shown in FIG. 1 described above, and thus, corresponding portions are denoted by the same reference symbols and are not described here. As in FIG. 1, FIG. 3 shows a case in which one cell constituting the main cell group 2 and one cell constituting the sense cell group 3 are connected in parallel for easy understanding. In actuality, however, the main cell group 2 and the sense cell group 3 each include a plurality of cells, and the plurality of cells are connected in parallel.

The semiconductor device 21 of the present embodiment includes the MOSFET 1, the drain terminal 4, the source terminal 5, the gate terminal 7, the Hall current sensor 9, the temperature sensing circuit 10, the gate control circuit 11, an operational amplifier 12, and an amplifier resistor 13. The semiconductor device 21 is connected to the load L and supplies power to the load L, similarly to the semiconductor device 20 of the first embodiment described above.

In the present embodiment, the source electrode of the sense cell group 3 is connected to one end of the amplifier resistor 13 and an inverting input terminal of the operational amplifier 12. The other end of the amplifier resistor 13 is connected to an output terminal of the operational amplifier 12. The output terminal of the operational amplifier 12 is connected to the temperature sensing circuit 10. A non-inverting input terminal of the operational amplifier 12 is connected to the source terminal 5.

The semiconductor device 20 of the first embodiment shown in FIG. 1 described above includes the sense resistor 8 for obtaining a sense conversion current. The semiconductor device 21 of the present embodiment is different from the semiconductor device 20 of the first embodiment in that it includes the operational amplifier 12 as shown in FIG. 3. Also in a case where the operational amplifier 12 is provided as in the present embodiment, a sense conversion current can be obtained as in the case where the sense resistor 8 is provided.

The operational amplifier 12 constitutes a current-voltage conversion circuit together with the amplifier resistor 13. The operational amplifier 12 outputs a value obtained by multiplying a sense current value by a resistance value of the amplifier resistor 13 (hereinafter, referred to as an "amplified voltage value" at times). The amplified voltage value corresponds to the sense current information and corresponds to the voltage drop value of the sense resistor 8 in the first embodiment. The operational amplifier 12 and the amplifier resistor 13 correspond to the sense current information sensing means. An amplified voltage signal including the amplified voltage value output from the operational amplifier 12 is supplied to the temperature sensing circuit 10.

The temperature sensing circuit 10 senses a sense current flowing through the sense cell group 3 based on the amplified voltage value included in the amplified voltage signal supplied from the operational amplifier 12. The temperature sensing circuit 10 senses the junction temperature of the MOSFET 1 based on the main current value, which is included in the main current signal supplied from the Hall current sensor 9, and the sense current value, which is sensed based on the amplified voltage value, as in the first embodiment.

As described above, the junction temperature of the MOSFET 1 can be sensed uniquely from the main current/sense conversion current ratio and the main current value on that occasion. In the present embodiment, the main current/sense conversion current ratio and the main current value on that occasion can be obtained from the amplified voltage value included in the amplified voltage signal supplied from the operational amplifier 12 and the sensed value of the Hall current sensor 9.

Specifically, the main current value can be obtained from the sensed value of the Hall current sensor 9. The main current/sense conversion current ratio is a ratio of the main current Im to the sense conversion current, which is a value obtained by dividing the main current value being a value of the main current Im by the value of the sense conversion current. In the present embodiment, the sense conversion current can be obtained from Expression (2) below in which the "voltage drop value of sense resistor" of Expression (1) above is replaced by the amplified voltage value included in the amplified voltage signal supplied from the operational amplifier 12 and the "value of sense resistor" of Expression (1) above is replaced by the resistance value of the amplifier resistor 13 (hereinafter, referred to as an "amplified resistance value").

(sense conversion current)=(amplified voltage value)×
(number of main cells)÷(number of sense cells)÷
(amplified resistance value)            (2)

Also in the present embodiment, with an increase of the main current Im to a constant junction temperature, the main current/sense conversion current ratio also increases monotonously. Accordingly, the junction temperatures of the MOSFET 1 in cases of various main current values can be sensed by matrixing, with desired temperature resolution and main current/sense conversion current ratio resolution, the graph for a plurality of main current values as shown in FIG. 2 described above and allocating the main current values obtained from the experiment to elements of a matrix.

As in the first embodiment, the temperature sensing circuit 10 pre-stores in a memory, for example, a table in which the main current value, the main current/sense conversion current ratio, and the junction temperature of the MOSFET 1 are matrixed, and derives the junction temperature of the MOSFET 1 with reference to the matrixed table by the IC in the temperature sensing circuit 10.

Also in the present embodiment as described above, as in the first embodiment, the temperature sensing circuit 10 senses the junction temperature of the MOSFET 1 based on the main current value, which is a value of the main current Im flowing through the main cell group 2, and the sense current value, which is a value of the sense current flowing through the sense cell group 3. Therefore, effects similar to those of the first embodiment can be achieved.

While the first and second embodiments described above have described the case in which the Hall current sensor 9 is provided as the sensor that senses the main current Im (hereinafter, referred to as a "main current sensing sensor" at times), a shunt resistor may be provided in another embodiment of the present invention. Also in a case where a shunt resistor is provided, similar effects to those of the first and second embodiments can be achieved. In a case of using a shunt resistor, the shunt resistor is disposed between the source terminal 5 and the load L and is electrically connected to the source terminal 5 and the load L.

While the first and second embodiments have described, as the method of sensing the main current Im, the case in which a main current sensing sensor such as the Hall current sensor 9 is provided outside the MOSFET 1 for sensing, the method of sensing the main current Im is not limited thereto. For example, the other sense cell group having the same temperature characteristics as those of the main cell group 2 may be provided separately from the sense cell group 3 having different temperature characteristics from those of the main cell group 2, to thereby obtain a main current value from a value of a sense current flowing through the other sense cell group (hereinafter, referred to as a "sense current value of the other sense cell group" at times). Similar effects to those of the first and second embodiments can be achieved also in a case where the main current value is obtained from the sense current value of the other sense cell group in this manner. In this case, the other sense cell group corresponds to the sense current information sensing means.

While the first and second embodiments have described the semiconductor devices 20 and 21 including the MOSFET 1 as a semiconductor transistor, the semiconductor transistor is not limited to a MOSFET. The semiconductor transistor may be, for example, an insulated gate bipolar transistor (abbreviated as IGBT). Effects similar to those of the first and second embodiments can be achieved also in a case where a semiconductor transistor is an IGBT.

In the first and second embodiments, though silicon (Si) may be used as a semiconductor material that is a main material of a semiconductor transistor such as the MOSFET 1 shown in FIG. 1, it is preferable to use a wide bandgap semiconductor having a larger bandgap than that of Si. Examples of the wide bandgap semiconductor include silicon carbide (SiC), gallium-nitride-based materials such as gallium nitride (GaN), and diamond.

A semiconductor transistor that is formed of a wide bandgap semiconductor (hereinafter, referred to as a "wide bandgap semiconductor transistor" at times) has higher withstand voltage characteristics and higher allowable current density than those of a semiconductor transistor formed of Si (hereinafter, referred to as "Si transistor" at times), which enables to downsize a semiconductor transistor. The use of a downsized semiconductor transistor as described above enables to downsize a semiconductor module being a semiconductor device in which those semiconductor transistors are incorporated as elements. A wide bandgap semiconductor has a smaller power loss compared with Si, and thus, the use of the wide bandgap semiconductor can enhance the efficiency of a semiconductor transistor, leading to higher efficiency of a semiconductor module.

A wide bandgap semiconductor transistor can operate at higher junction temperatures compared with a Si transistor. For example, a SiC transistor mainly formed of SiC can operate at junction temperatures of 200° C. or higher, as described in Reference 2 (page 1034, FIG. 8) below.

Reference 2: A. Lostetter and 11 others, "High-Temperature Silicon Carbide and Silicon on Insulator Based Integrated Power Modules", VPPC '09, IEEE, 2009. vol. 2, pp. 1032-1035.

In the first and second embodiments, the temperature sense and protection circuit composed of the temperature sensing circuit 10 and the gate control circuit 11 rapidly and accurately senses an abrupt temperature rise inside the MOSFET 1 and controls the MOSFET 1 rapidly as described above, to thereby protect the MOSFET 1. With the use of a wide bandgap semiconductor transistor such as a SiC transistor as a transistor of the above-mentioned semiconductor device, the temperature sensing circuit 10 measures the temperature characteristics of the transistor, and the gate control circuit 11 controls the transistor. This enables to operate a transistor safely even if the junction temperature of the transistor reaches 200° C. or higher. Accordingly, the range of a safe operating temperature of a semiconductor device including a temperature sense and protection circuit can be extended. In other words, a semiconductor device having an extended range of safe operating temperature can be achieved.

Third Embodiment

Figure 4:
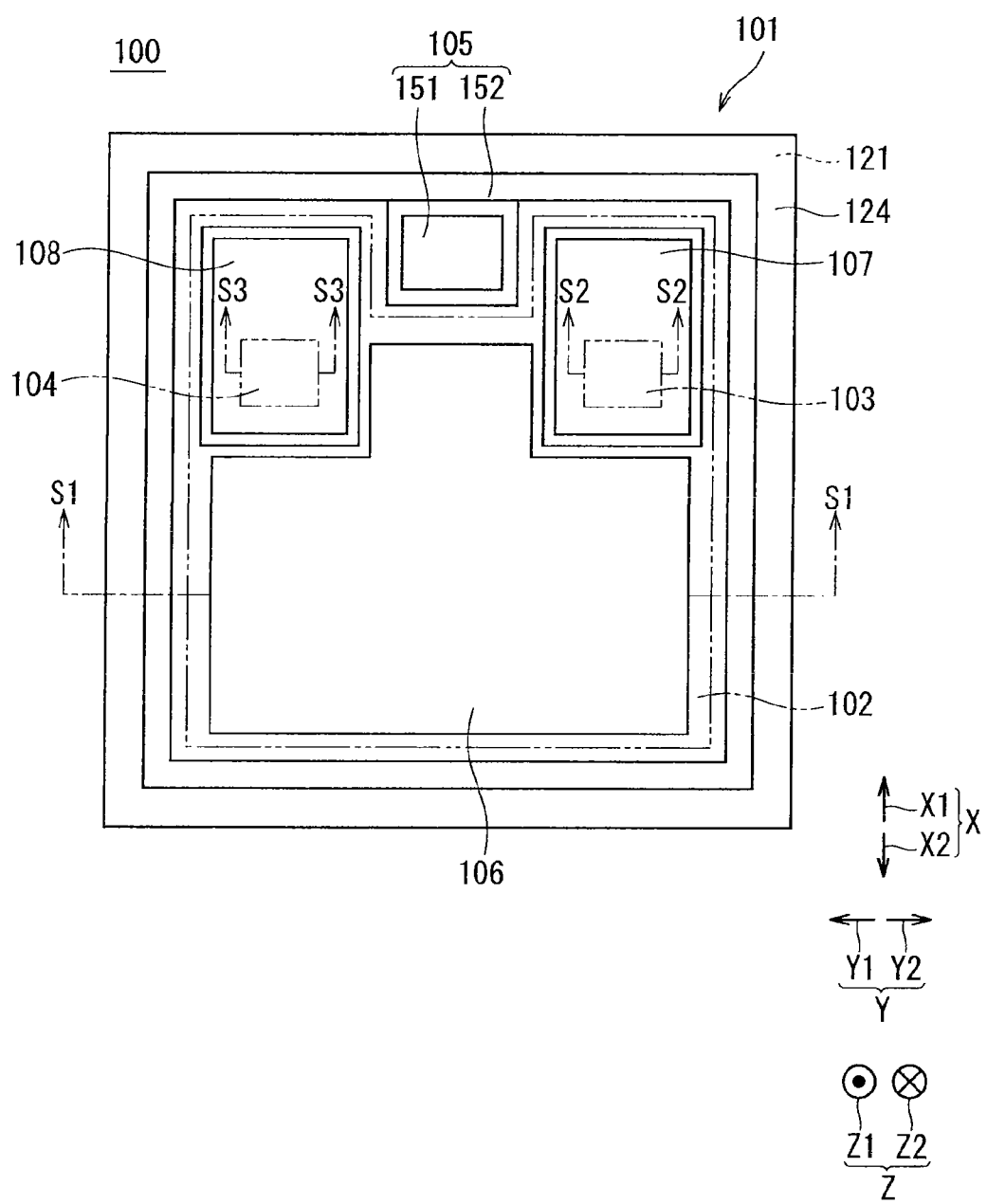
FIG. 4 is a plan view showing a semiconductor device 100 according to a third embodiment of the present invention.

FIG. 4 is a plan view showing a semiconductor device 100 according to a third embodiment of the present invention. The semiconductor device 100 of the present embodiment has a function of sensing temperature information that is the information regarding the temperature of a semiconductor transistor contained therein, similarly to the semiconductor device 20, 21 of the first and second embodiments. In the present embodiment, the semiconductor device 100 further has a function of sensing current information that is the information regarding a current flowing through the semiconductor transistor contained therein. That is, the semiconductor device 100 of the present embodiment is configured so as to sense the temperature information and current information of a semiconductor transistor and has a function of sensing an over-temperature and an over-current of the semiconductor transistor.]

In the present embodiment, the semiconductor device 100 senses the temperature of a semiconductor transistor, specifically, the internal temperature of the semiconductor transistor as the temperature information of a semiconductor transistor. The present embodiment adopts the configuration described below for providing the semiconductor device 100 capable of obtaining a function of rapidly and accurately sensing the information regarding an internal temperature of a semiconductor transistor while suppressing an increase of manufacturing steps, and for providing a semiconductor device capable of sensing an over-temperature and an over-current of a semiconductor transistor while suppressing a reduction of an effective area of a semiconductor transistor.

Figure 5:
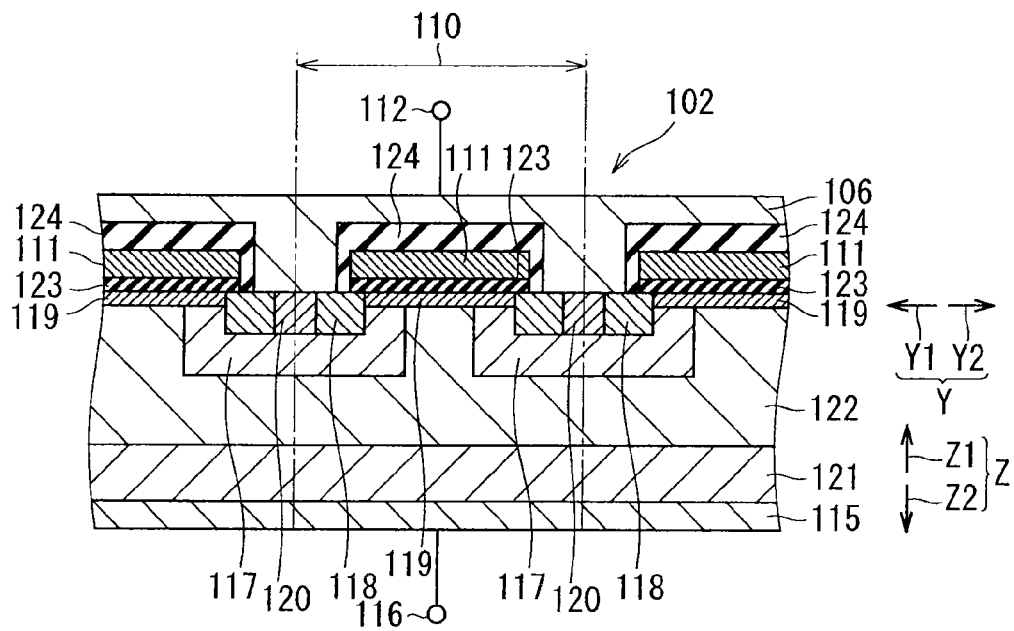
FIG. 5 is a cross-sectional view showing a main cell group 102 shown FIG. 4, which is viewed from a cutting line S1-S1 of FIG. 4.
Figure 6:
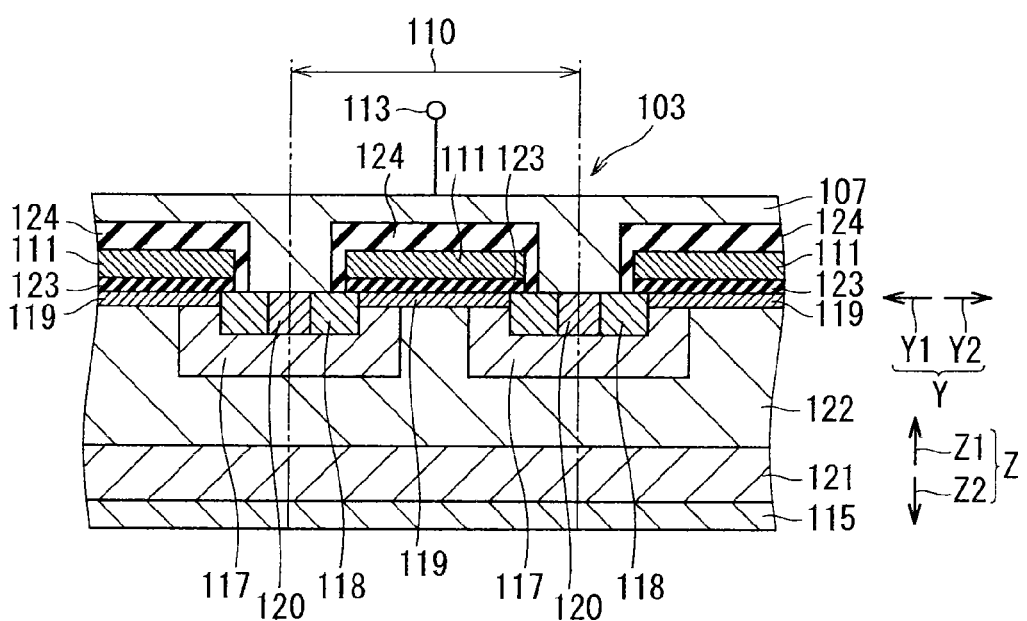
FIG. 6 is a cross-sectional view showing a first sense cell group 103 shown in FIG. 4, which is viewed from a cutting line S2-S2 of FIG. 4.
Figure 7:
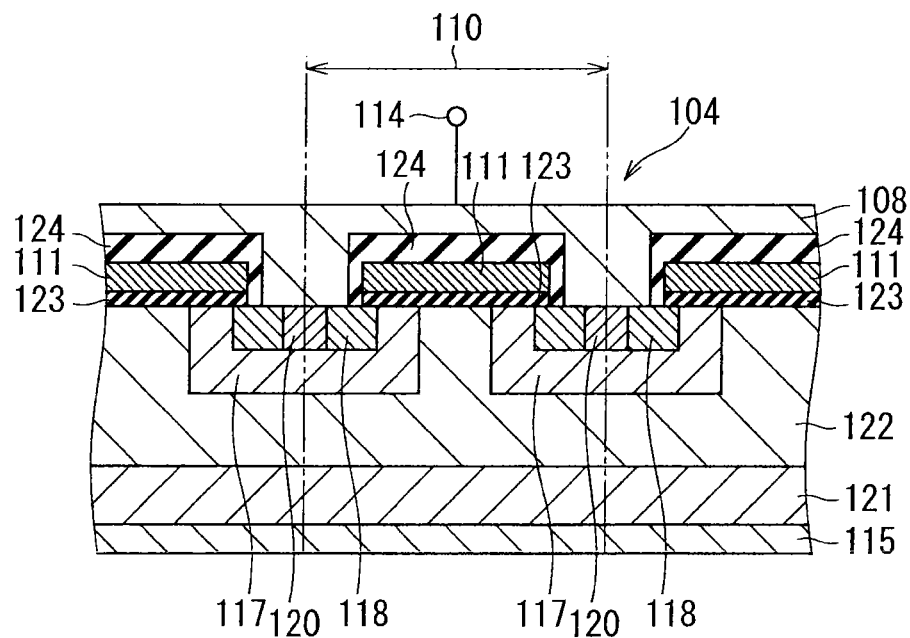
FIG. 7 is a cross-sectional view showing a second sense cell group 104 shown in FIG. 4, which is viewed from a cutting line S3-S3 of FIG. 4.

FIG. 5 is a cross-sectional view showing a main cell group 102 shown in FIG. 4, which is viewed from the cutting line S1-S1 of FIG. 4. FIG. 6 is a cross-sectional view showing a first sense cell group 103 shown in FIG. 4, which is viewed from the cutting line S2-S2 of FIG. 4. FIG. 7 is a cross-sectional view showing a second sense cell group 104 shown in FIG. 4, which is viewed from the cutting line S3-S3 of FIG. 4.

Figure 34:
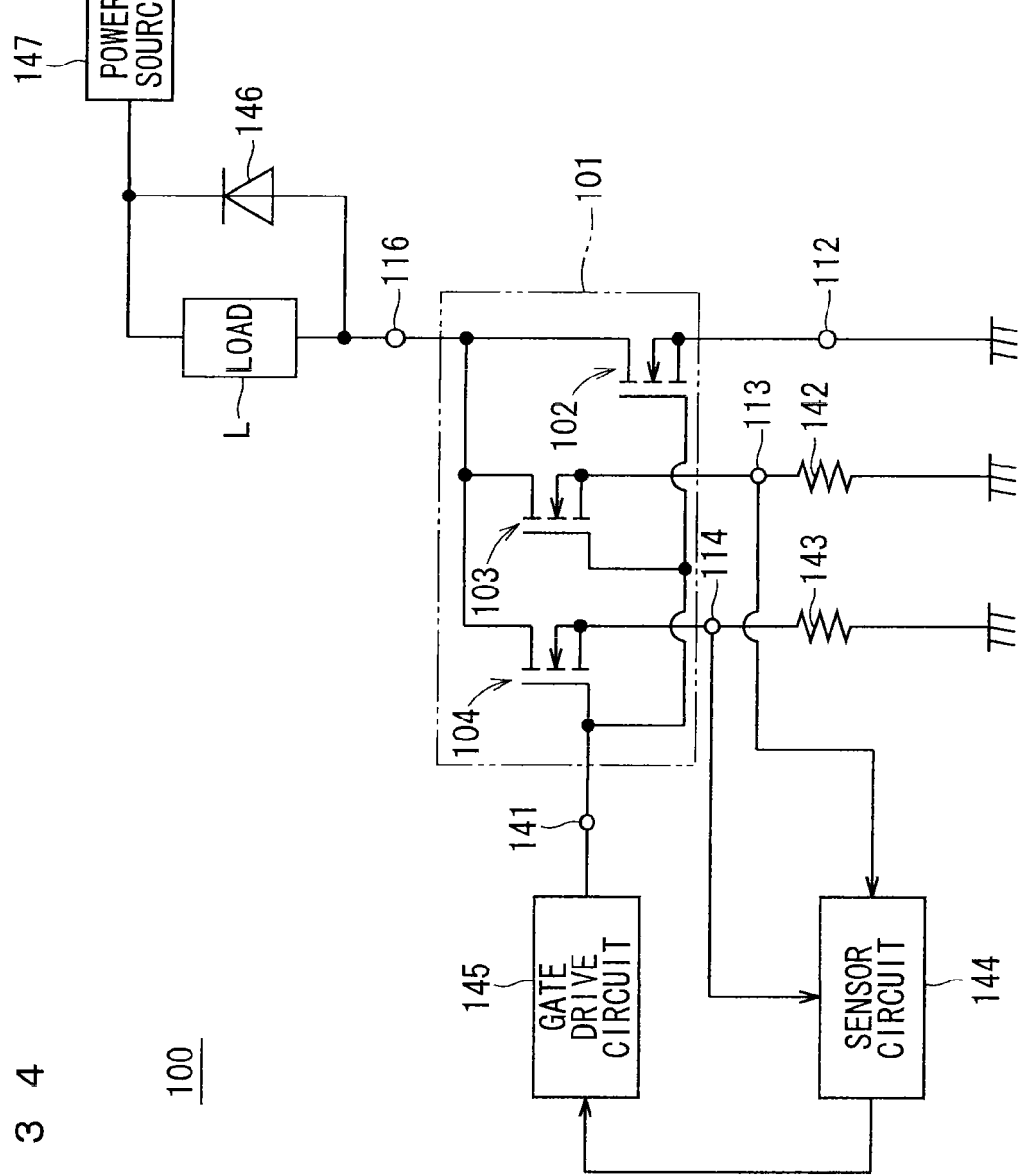
FIG. 34 is an electrical circuit diagram showing the configuration of the semiconductor device 100 according to one embodiment of the present invention.

The semiconductor device 100 of the present embodiment is a semiconductor device including a silicon carbide (SiC) semiconductor being a wide bandgap semiconductor. The semiconductor device 100 is preferably used as a power semiconductor device. In the semiconductor device 100, a MOSFET 101 is formed on a silicon carbide (SiC) substrate 121 being a semiconductor substrate. In actuality, the semiconductor device 100 is configured so that a sensor circuit 144, a gate drive circuit 145, and the like are connected to the MOSFET 101 as shown in FIG. 34 described below. In FIG. 4, however, the components other than the MOSFET 101 are not described for easy understanding. FIG. 4 is a plan view which is viewed from one side in a thickness direction of the SiC substrate 121. The cross-sectional configurations shown in FIGS. 5 to 7 are parallel to the thickness direction of the SiC substrate 121.

The MOSFET 101 includes the main cell group 102, the first sense cell group 103, and the second sense cell group 104. The main cell group 102, the first sense cell group 103, and the second sense cell group 104 are formed on the SiC substrate 121 that is the same semiconductor substrate. Specifically, the MOSFET 101 is composed of a plurality of cells 110. The plurality of cells 110 are formed on the SiC substrate 121 that is the same semiconductor substrate, and are connected in parallel. As shown in FIGS. 5 to 7, the region between the centers of well contact regions 120 constitutes one cell 110. The cells 110 are repeatedly disposed in the width direction perpendicular to the thickness direction of the SiC substrate 121, which is the horizontal direction of the sheet in FIGS. 5 to 7, and front and back sides of the sheet in FIGS. 5 to 7, whereby the MOSFET 101 is formed. Each cell 110 includes one gate region 111.

Hereinafter, the thickness direction of the SiC substrate 121 is denoted by "Z", where one in the thickness direction Z is denoted by "Z1" and the other in the thickness direction Z is denoted by "Z2". In the present embodiment, the SiC substrate 121 has a rectangular shape, specifically, a square shape. The direction that is perpendicular to the thickness direction Z of the SiC substrate 121 and is parallel to one side portion of the SiC substrate 121 is defined as a "first direction X", where one in the first direction X is denoted by "X1" and the other in the first direction X is denoted by "X2". The direction that is perpendicular to the thickness direction Z of the SiC substrate 121 and is perpendicular to the first direction X is defined as a "second direction Y", where one in the second direction Y is denoted by "Y1" and the other in the second direction Y is denoted by "Y2". The second direction Y is parallel to the side portion of the SiC substrate 121 that is orthogonal to the side portion thereof that is parallel to the first direction X. In the present embodiment, the vertical direction of the sheet in FIG. 4 is the first direction X, and the horizontal direction of the sheet in FIG. 4 is the second direction Y.

The main cell group 102 includes partial cells of the plurality of cells 110 constituting the MOSFET 101. A relatively large current flows through the main cell group 102. In the present embodiment, most of the current conducted to the MOSFET 101 flows through the main cell group 102.

The first and second sense cell groups 103 and 104 each include other partial cells of the plurality of cells 110 constituting the MOSFET 101. More specifically, the first sense cell group 103 includes at least part of the other cells among the plurality of cells 110 constituting the MOSFET 101, except for the cells included in the main cell group 102 and the second sense cell group 104. The first sense cell group 103 corresponds to the other sense cell group, and the second sense cell group 104 corresponds to the sense cell group.

A relatively small current flows through the first and second sense cell groups 103 and 104. The first and second sense cell groups 103 and 104 are partial cell groups used for temperature sensing or current sensing. The first and second sense cell groups 103 and 104 are used for, for example, temperature sensing and are used for sensing the internal temperature of the MOSFET 101. The main cell group 102, the first sense cell group 103, and the second sense cell group 104 each include the plurality of cells 110.

The first sense cell group 103 has the same channel structure as that of the main cell group 102. The second sense cell group 104 has a different channel structure from that of the main cell group 102. That is, the first sense cell group 103 and the second sense cell group 104 have different channel structures.

Therefore, the first sense cell group 103 and the second sense cell group 104 have different temperature characteristics. More specifically, the cells constituting the first sense cell group 103 and the cells constituting the second sense cell group 104 have different temperature characteristics. The temperature characteristics show, as described above, changes in electrical characteristics to changes in temperature of the MOSFET 101, specifically, junction temperature of the MOSFET 101.

The MOSFET 101 is an n-channel-type MOSFET in the present embodiment. The main cell group 102 includes the SiC substrate 121 of n-type, a silicon carbide drift layer 122 of n-type, a base region 117 of p-type, an source region 118 of n-type, a channel region 119, the well contact region 120 of p-type, a gate insulating film 123, the gate region 111, an interlayer insulating film 124, a main source electrode 106, and a drain electrode 115.

The first sense cell group 103 has a similar configuration to that of the main cell group 102 except for that it includes a first sense source electrode 107 in place of the main source electrode 106. That is, the first sense cell group 103 includes the SiC substrate 121, a silicon carbide drift layer 122, the base region 117, the source region 118, the channel region 119, the well contact region 120, the gate insulating film 123, the gate region 111, the interlayer insulating film 124, the first sense source electrode 107, and the drain electrode 115.

The second sense cell group 104 has a similar configuration to that of the main cell group 102 except for that it includes a second sense source electrode 108 in place of the main source electrode 106 and does not include the channel region 119. That is, the second sense cell group 104 includes the SiC substrate 121, the silicon carbide drift layer 122, the base region 117, the source region 118, the well contact region 120, the gate insulating film 123, the gate region 111, the interlayer insulating film 124, the second sense source electrode 108, and the drain electrode 115.

The gate regions 111 of the main cell group 102, the first sense cell group 103, and the second sense cell group 104 are connected to a gate electrode 105 common thereto. The main cell group 102 is connected to a main source terminal 112 via the main source electrode 106. The first sense cell group 103 is connected to a first sense source terminal 113 via the first sense source electrode 107. The second sense cell group 104 is connected to a second sense source terminal 114 via the second sense source electrode 108.

The main source electrode 106 is formed into a convex shape such that, viewed from the Z1 side in the thickness direction of the SiC substrate 121, the center portion thereof in the second direction Y that is horizontal to the sheet in FIG. 4 projects toward the upper side in the first direction X that is vertical to the sheet in FIG. 4, that is, toward X1 in the first direction. The first and second sense source electrodes 107 and 108 are formed into a rectangular shape, specifically, an oblong shape when viewed from the Z1 side in the thickness direction of the SiC substrate 121, and are respectively disposed on both sides of the portion projecting (hereinafter, referred to as "projecting portion") of the main source electrode 106. The first and second sense source electrodes 107 and 108 are provided to extend, beyond the projecting portion of the main source electrode 106, toward the upper side of the sheet in FIG. 4, that is, toward X1 in the first direction. A rectangular portion (hereinafter, referred to as a "pad part" at times) 151 that serves as an external output pad of the gate electrode 105 is disposed in a portion that is opposed to the projecting portion of the main source electrode 106 and is located between the two first and second sense source electrodes 107 and 108.

The gate electrode 105 includes the pad part 151 and an enclosure 152 that is electrically connected to the pad part 151 and is provided so as to surround the main cell group 102, the first sense cell group 103, and the second sense cell group 104. More specifically, the enclosure 152 of the gate electrode 105 is provided so as to surround the main source electrode 106, the first sense source electrode 107, and the second sense source electrode 108. The gate electrode 105 is electrically connected to the gate region 111 via the enclosure 152 around the main source electrode 106, the first sense source electrode 107, and the second sense source electrode 108, and functions as an external output electrode of the gate region 111.

The main source electrode 106, the first sense source electrode 107, and the second sense source electrode 108 are each electrically connected to the source region 118 and the well contact region 120 via contact holes. The main source electrode 106, the first sense source electrode 107, and the second sense source electrode 108 serve as external output electrodes per se.

The drain electrode 115 is common to the all cells 110 constituting the main cell group 102, the first sense cell group 103, and the second sense cell group 104, and is connected to a drain terminal 116. The drain electrode 115 is formed over the entire surface on the Z2 side in the thickness direction of the SiC substrate 121. The drain electrode 115 functions as an external output electrode per se.

The all cells 110 constituting the main cell group 102, the first sense cell group 103, and the second sense cell group 104 include the base region 117, the source region 118, and the well contact region 120, and perform a switching operation as the MOSFET 101. The main cell group 102 and the first sense cell group 103 include the channel region 119, and have a smaller threshold voltage than that of the second sense cell group 104.

The MOSFET 1 according to the first and second embodiments described above has a similar configuration to that of the MOSFET 101 according to the present embodiment except for that it does not include the first sense cell group 103 corresponding to the other sense cell group. Specifically, the main cell group 2 of the MOSFET 1 according to the first and second embodiments has a similar configuration to that of the main cell group 102 of the MOSFET 101 according to the present embodiment. Also, the sense cell group 3 of the MOSFET 1 according to the first and second embodiments has a similar configuration to that of the second sense cell group 104 of the MOSFET 101 according to the present embodiment.

Next, the method of manufacturing the semiconductor device 100 according to one embodiment of the present invention is described. FIGS. 8 to 31 are views for describing the method of manufacturing the semiconductor device 100 according to one embodiment of the present invention. As in FIGS. 5 to 7, FIGS. 8 to 31 show the cross-sectional configurations parallel to the thickness direction of the SiC substrate 121.

Figure 8:
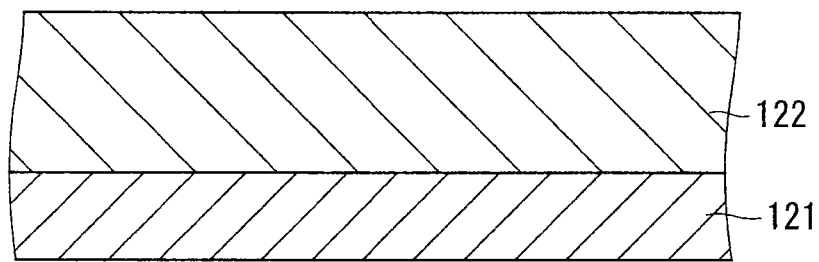
FIG. 8 is a cross-sectional view showing a state at a stage when the formation of a silicon carbide drift layer 122 was finished.

FIG. 8 is a cross-sectional view showing a state at a stage when the formation of the silicon carbide drift layer 122 was finished. First, the silicon carbide drift layer 122 is formed on a surface of one side in the thickness direction of the silicon carbide (SiC) substrate 121. The silicon carbide drift layer 122 is formed over the entire surface of one side in the thickness direction of the SiC substrate 121. That is, the silicon carbide drift layer 122 is formed over a region (hereinafter, referred to as a "main cell group formation region") 102A predetermined as a region in which the main cell group 102 is formed, a region (hereinafter, referred to as a "first sense cell group formation region") 103A predetermined as a region in which the first sense cell group 103 is formed, and a region (hereinafter, referred to as a "second sense cell group formation region") 104A predetermined as a region in which the second sense cell group 104 is formed. The state shown in FIG. 8 corresponds to the state of each of the main cell group formation region 102A, the first sense cell group formation region 103A, and the second sense cell group formation region 104A.

An n-type SiC substrate having a low resistance is used as the SiC substrate 121. The silicon carbide drift layer 122 is formed as an n-type semiconductor layer made of silicon carbide. The silicon carbide drift layer 122 is formed through epitaxial growth by, for example, the chemical vapor deposition (abbreviated as CVD) process. The concentration of n-type impurities in the silicon carbide drift layer 122 is, for example, $1\times10^{15}$ cm$^{-3}$ to $1\times10^{17}$ cm$^{-3}$. The thickness dimension (hereinafter, referred to as a "thickness" at times) of the silicon carbide drift layer 122 is, for example, 5 μm to 50 μm.

Figure 9:
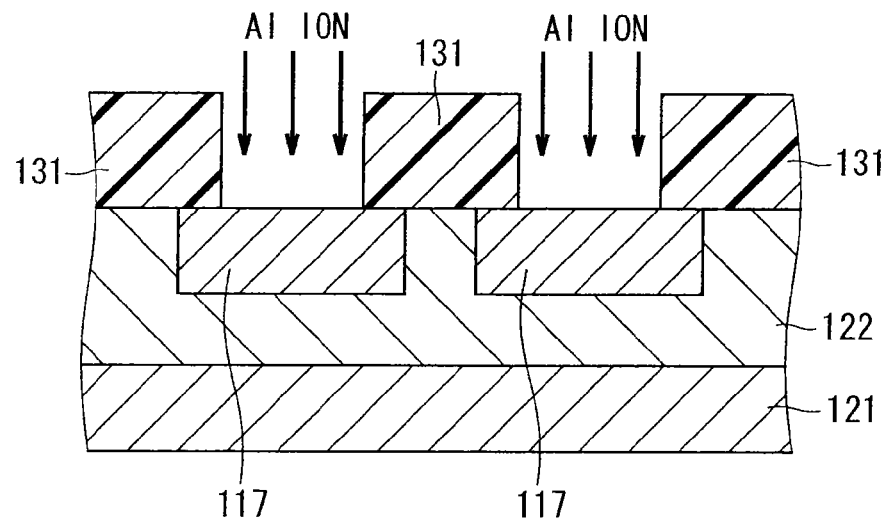
FIG. 9 is a cross-sectional view showing a state at a stage when the formation of a base region 117 was finished.

FIG. 9 is a cross-sectional view showing a state at a stage when the formation of the base region 117 was finished. The state shown in FIG. 9 corresponds to the state of each of the main cell group formation region 102A, the first sense cell group formation region 103A, and the second sense cell group formation region 104A.

As shown in FIG. 9, after the formation of the silicon carbide drift layer 122, a first mask 131 is formed on a surface of a side of the silicon carbide drift layer 122 that is opposite to the side in contact with the SiC substrate 121, that is, on a surface of one side in the thickness direction thereof. Then, impurities of p-type (hereinafter, referred to as "p-type impurities" at times), specifically, aluminum (Al) is ion-implanted, from one side in the thickness direction of the SiC substrate 121, into the surface of the silicon carbide drift layer 122 on which the first mask 131 is formed. As a result, p-type impurities are ion-implanted into the surface of the silicon carbide drift layer 122, which is located in a portion not covered with the first mask 131.

The region into which p-type impurities are ion-implanted in the silicon carbide drift layer 122 is rendered p-type. The region rendered p-type serves as the base region 117. The base region 117 is formed in each of the main cell group formation region, the first sense cell group formation region, and the second sense cell group formation region. The depth in ion implantation of p-type impurities, that is, the thickness of the base region 117 is set so as not to exceed the thickness of the silicon carbide drift layer 122, specifically, which is approximately 0.5 μm to 3 μm. The concentration of the ion-implanted p-type impurities (hereinafter, referred to as a "p-type impurity concentration" at times), that is, p-type impurity concentration of the base region 117 falls within the range of $1\times10^{17}$ cm$^{-3}$ to $1\times10^{19}$ cm$^{-3}$ and is higher than the p-type impurity concentration of the silicon carbide drift layer 122.

Figure 10:
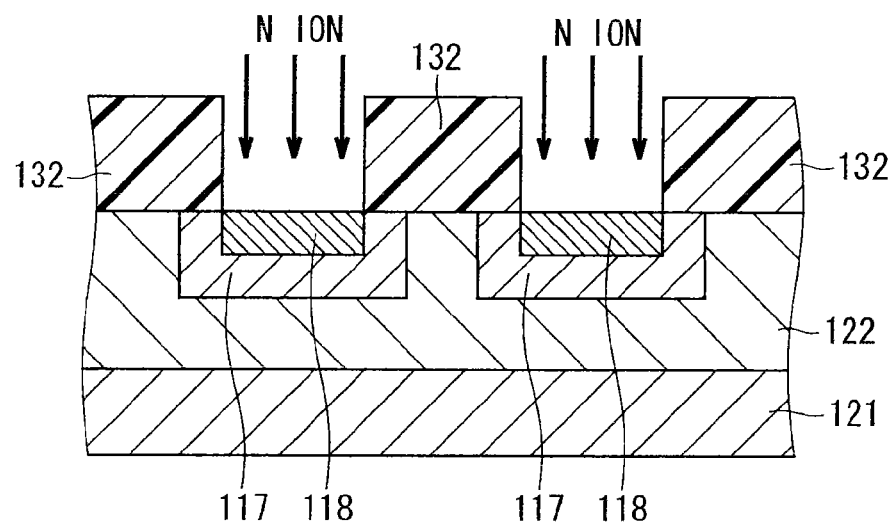
FIG. 10 is a cross-sectional view showing a state at a stage when the formation of a source region 118 was finished.

FIG. 10 is a cross-sectional view showing a state at a stage when the formation of the source region 118 was finished. The state shown in FIG. 10 corresponds to the state of each of the main cell group formation region 102A, the first sense cell group formation region 103A, and the second sense cell group formation region 104A.

After the formation of the base region 117, the first mask 131 is removed. Then, as shown in FIG. 10, a second mask 132 is newly formed on the surface of one side in the thickness direction of the silicon carbide drift layer 122. Then, impurities of n-type (hereinafter, referred to as "n-type impurities" at times), specifically, nitrogen (N) is ion-implanted, from one side in the thickness direction of the SiC substrate 121, into the surface of the silicon carbide drift layer 122 on which the second mask 132 is formed, specifically, a part of the surface of the base region 117. As a result, n-type impurities are ion-implanted into a surface of the silicon carbide drift layer 122, which is not covered with the second mask 132, specifically, into a part of the surface of the base region 117.

The region into which n-type impurities are ion-implanted in the silicon carbide drift layer 122, specifically, the region into which n-type impurities are ion-implanted in the base region 117 is rendered n-type. The region rendered n-type serves as the source region 118. The source region 118 is formed in each of the main cell group formation region 102A, the first sense cell group formation region 103A, and the second sense cell group formation region 104A.

The depth in ion implantation of n-type impurities, that is, the thickness of the source region 118 is smaller than the thickness of the base region 117. In other words, the source region 118 is formed to be shallower than the base region 117. The concentration of the ion-implanted n-type impurities (hereinafter, referred to as an "n-type impurity concentration" at times), that is, the n-type impurity concentration of the source region 118 falls within, for example, the range of $1\times10^{18}$ cm$^{-3}$ to $1\times10^{21}$ cm$^{-3}$ and exceeds the p-type impurity concentration of the base region 117, that is, is higher than the p-type impurity concentration of the base region 117.

Figure 13:
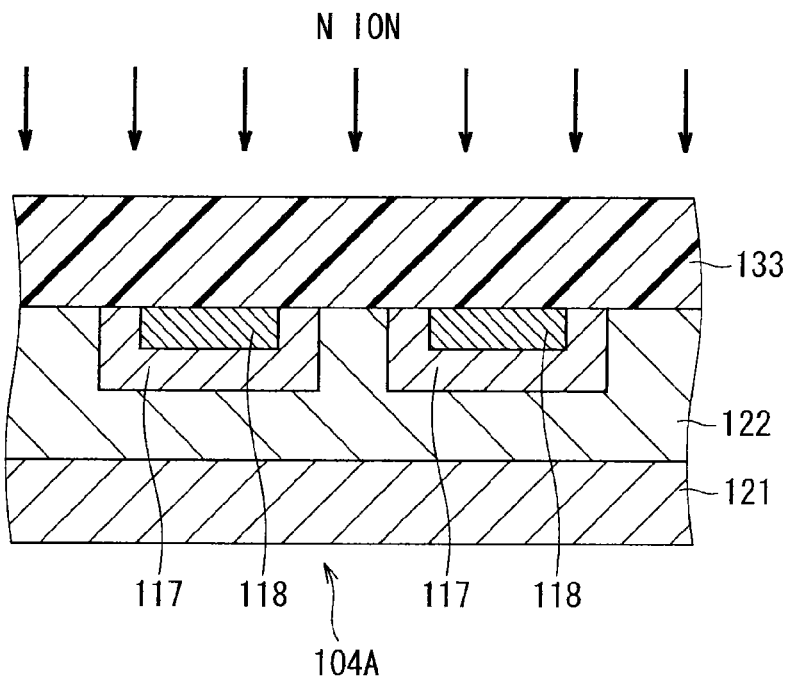
FIG. 13 is a cross-sectional view showing a state of a second sense cell group formation region 104A at the stage when the formation of the channel region 119 was finished.

FIGS. 11 to 13 are cross-sectional views showing states at a stage when the formation of the channel region 119 was finished. FIG. 11 is the cross-sectional view showing the state of the main cell group formation region 102A at the stage when the formation of the channel region 119 was finished. FIG. 12 is the cross-sectional view showing the state of the first sense cell group formation region 103A at the stage when the formation of the channel region 119 was finished. FIG. 13 is the cross-sectional view showing the state of the second sense cell group formation region 104A at the stage when the formation of the channel region 119 was finished.

After the formation of the source region 118, the second mask 132 is removed. Then, as shown in FIGS. 11 to 13, a third mask 133 is newly formed on the surface on one side in the thickness direction of the silicon carbide drift layer 122. The third mask 133 is formed so as not to cover but to expose the silicon carbide drift layers 122 of the main cell group formation region 102A shown in FIG. 11 and the first sense cell group formation region 103A shown in FIG. 12 and to cover the surface of the silicon carbide drift layer 122 of the second sense cell group formation region 104A as shown in FIG. 13.

N-type impurities, specifically, N is ion-implanted from one side in the thickness direction of the SiC substrate 121, into the surface of the silicon carbide drift layer 122 on which the third mask 133 is formed. As a result, n-type impurities are ion-implanted into the surface of the silicon carbide drift layer 122, which is not covered with the third mask 133, specifically, into the surfaces of the silicon carbide drift layers 122 of the main cell group formation region 102A shown in FIG. 11 and the first sense cell group formation region 103A shown in FIG. 12.

Of the silicon carbide drift layer 122, the region that has not been n-type before ion implantation is rendered n-type through ion implantation of n-type impurities. Of the region of the silicon carbide drift layer 122 into which n-type impurities are ion-implanted, the region that has not been n-type, that is, of the silicon carbide drift layers 122 of the main cell group formation region 102A shown in FIG. 11 and the first sense cell group formation region 103A shown in FIG. 12, the remaining region except for the source region 118 that has been n-type, is rendered n-type. The region rendered n-type serves as the channel region 119.

The depth in ion implantation of n-type impurities, that is, the thickness of the channel region 119 is smaller than that of the source region 118. In other words, the channel region 119 is formed to be shallower than the source region 118. The concentration of the ion-implanted n-type impurities, that is, the n-type impurity concentration of the channel region 119 falls within, for example, the range of $1 \times 10^{17}$ cm$^{-3}$ to $1 \times 10^{19}$ cm$^{-3}$.

Figure 14:
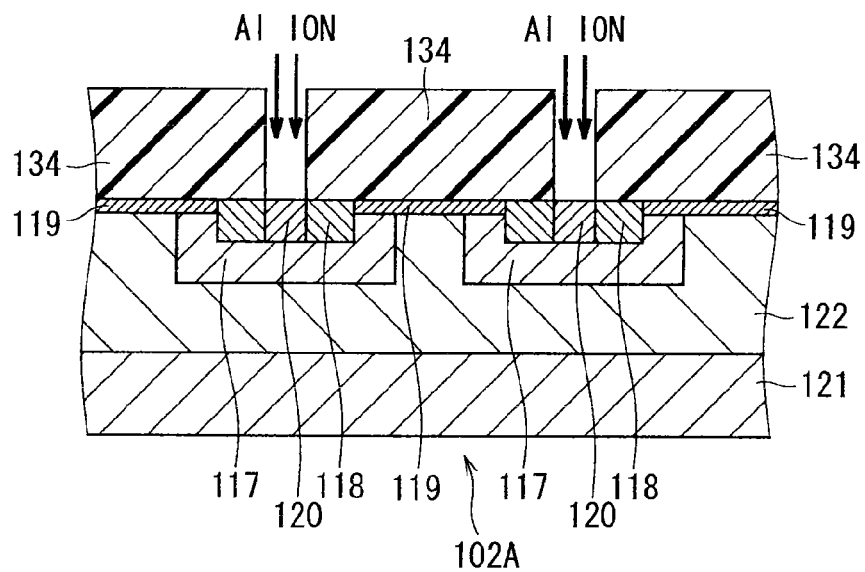
FIG. 14 is a cross-sectional view showing a state of the main cell group formation region 102A at a stage when the formation of the well contact region 120 was finished.
Figure 15:
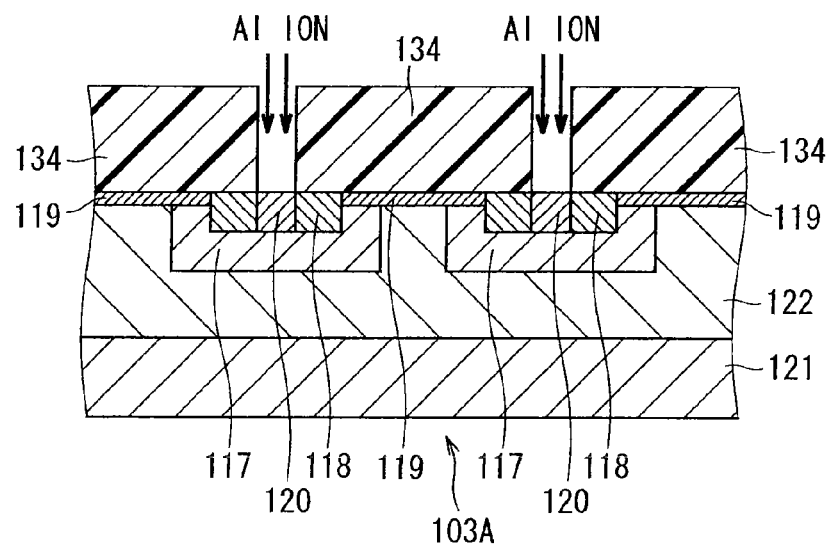
FIG. 15 is a cross-sectional view showing a state of the first sense cell group formation region 103A at the stage when the formation of the well contact region 120 was finished.
Figure 16:
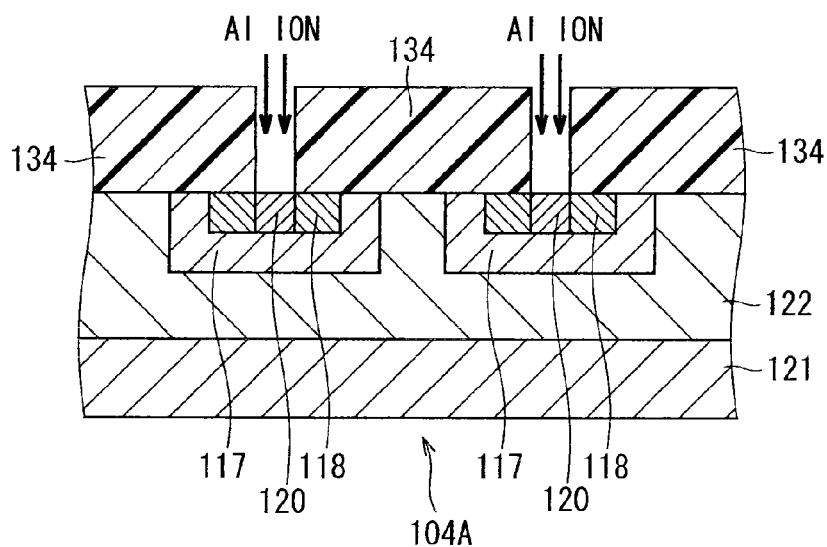
FIG. 16 is a cross-sectional view showing a state of the second sense cell group formation region 104A at the stage when the formation of the well contact region 120 was finished.

FIGS. 14 to 16 are cross-sectional views showing states at a stage when the formation of the well contact region 120 was finished. FIG. 14 is the cross-sectional view showing the state of the main cell group formation region 102A at the stage when the formation of the well contact region 120 was finished. FIG. 15 is the cross-sectional view showing the state of the first sense cell group formation region 103A at the stage when the formation of the well contact region 120 was finished. FIG. 16 is the cross-sectional view showing the state of the second sense cell group formation region 104A at the stage when the formation of the well contact region 120 was finished.

After the formation of the channel region 119, the third mask 133 is removed. Then, as shown in FIGS. 14 to 16, a fourth mask 134 is newly formed on a surface of one side in the thickness direction of the silicon carbide drift layer 122. The fourth mask 134 is opened in a region (hereinafter, referred to as a "well contact formation region" at times) predetermined as the region in which the well contact region 120 is formed in the source region 118 formed in the silicon carbide drift layer 122, and is formed so as to cover the silicon carbide drift layer 122 in the other region. P-type impurities, specifically, Al is ion-implanted from one side in the thickness direction of the SiC substrate 121, into the surface of the silicon carbide drift layer 122 on which the fourth mask 134 is formed. As a result, p-type impurities are ion-implanted into the surface of the silicon carbide drift layer 122 which is not covered with the fourth mask 134, that is, the well contact formation region of the source region 118.

In the silicon carbide drift layer 122, the region into which p-type impurities are ion-implanted, that is, the well contact formation region of the source region 118 has been n-type before ion implantation, but is rendered p-type through ion implantation of p-type impurities. The region rendered p-type serves as the well contact region 120.

The depth in ion implantation of p-type impurities, that is, the thickness of the well contact region 120 is described as an equal thickness to that of the source region 118 in FIGS. 14 to 16, which is in actuality larger than that of the source region 118 and is smaller than that of the base region 117. In other words, the well contact region 120 is formed to be deeper than the source region 118 and shallower than the base region 117.

The concentration of the ion-implanted p-type impurities falls within, for example, the range of $1 \times 10^{19}$ cm$^{-3}$ to $1 \times 10^{21}$ cm$^{-3}$, and exceeds the n-type impurity concentration of the source region 118, that is, is larger than the n-type impurity concentration of the source region 118.

Then, the fourth mask 134 is removed, and annealing is performed under atmosphere of an inert gas such as an argon (Ar) gas by a heat treatment device. Annealing is performed at a temperature of, for example, 1,300° C. to 1,900° C. for 30 seconds to one hour. Upon annealing, n-type impurities such as N and p-type impurities such as Al that have been ion-implanted are activated.

Figure 19:
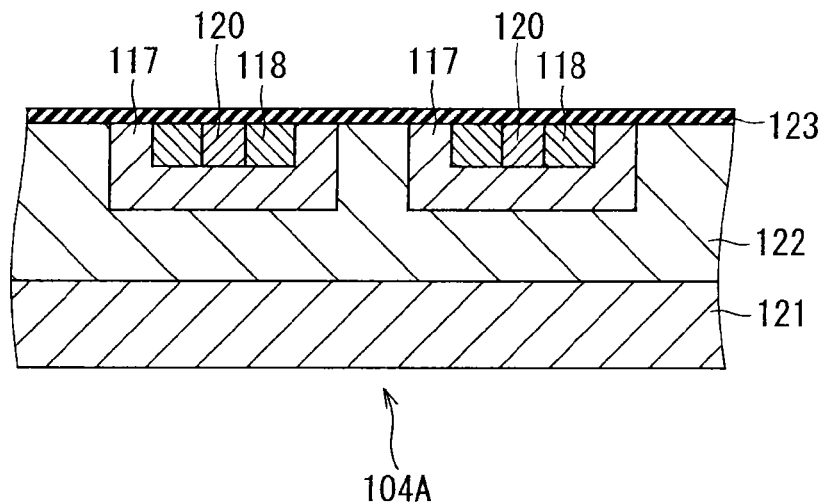
FIG. 19 is a cross-sectional view showing a state of the second sense cell group formation region 104A at the stage when the formation of the gate insulating film 123 was finished.

FIGS. 17 to 19 are cross-sectional views showing states at a stage when the formation of the gate insulating film 123 was finished. FIG. 17 is the cross-sectional view showing the state of the main cell group formation region 102A at the stage when the formation of the gate insulating film 123 was finished. FIG. 18 is the cross-sectional view showing the state of the first sense cell group formation region 103A at the stage when the formation of the gate insulating film 123 was finished. FIG. 19 is the cross-sectional view showing the state of the second sense cell group formation region 104A at the stage when the formation of the gate insulating film 123 was finished. After forming and then annealing the well contact region 120, as shown in FIGS. 17 to 19, the surface of the silicon carbide drift layer 122 including the base region 117, the source region 118, the channel region 119, and the well contact region 120 is thermally oxidized, to thereby form the gate insulating film 123 having a desired thickness.

Figure 20:
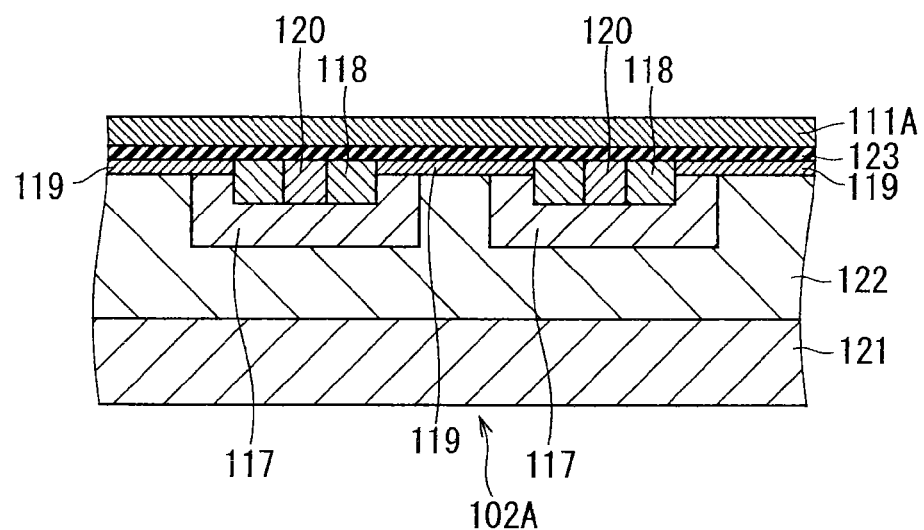
FIG. 20 is a cross-sectional view showing a state of the main cell group formation region 102A at a stage when the formation of a gate conductive film 111A was finished.
Figure 21:
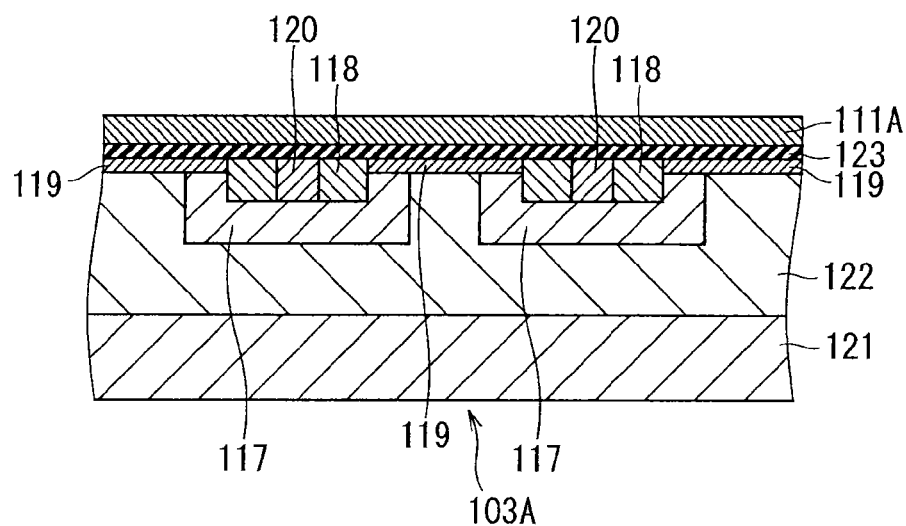
FIG. 21 is a cross-sectional view showing a state of the first sense cell group formation region 103A at the stage when the formation of the gate conductive film 111A was finished.
Figure 22:
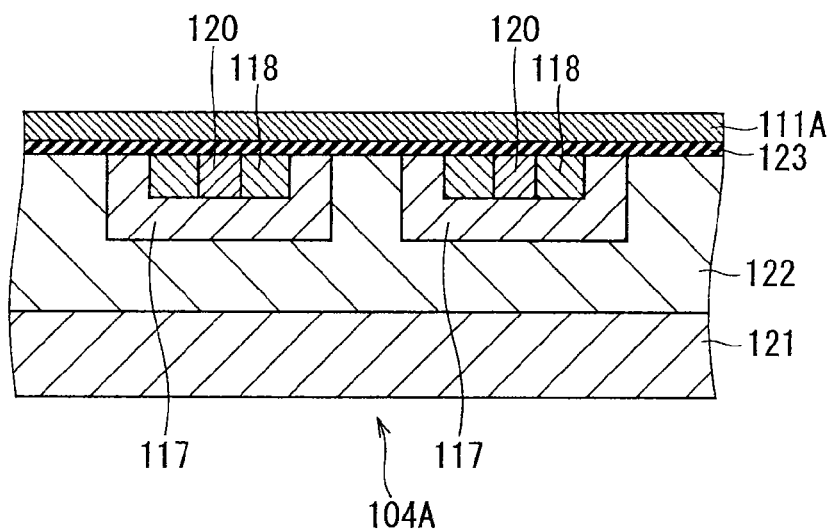
FIG. 22 is a cross-sectional view showing a state of the second sense cell group formation region 104A at the stage when the formation of the gate conductive film 111A was finished.

FIGS. 20 to 22 are cross-sectional views showing states at a stage when the formation of a gate conductive film 111A was finished. FIG. 20 is the cross-sectional view showing the state of the main cell group formation region 102A at the stage when the formation of the gate conductive film 111A was finished. FIG. 21 is the cross-sectional view showing the state of the first sense cell group formation region 103A at the stage when the formation of the gate conductive film 111A was finished. FIG. 22 is the cross-sectional view showing the state of the second sense cell group formation region 104A at the stage when the formation of the gate conductive film 111A was finished. After the formation of the gate insulating film 123, as shown in FIGS. 20 to 22, the gate conductive film 111A to serve as the gate region 111, specifically, a conductive polysilicon film is formed on the gate insulating film 123 by, for example, the low pressure CVD method.

Figure 23:
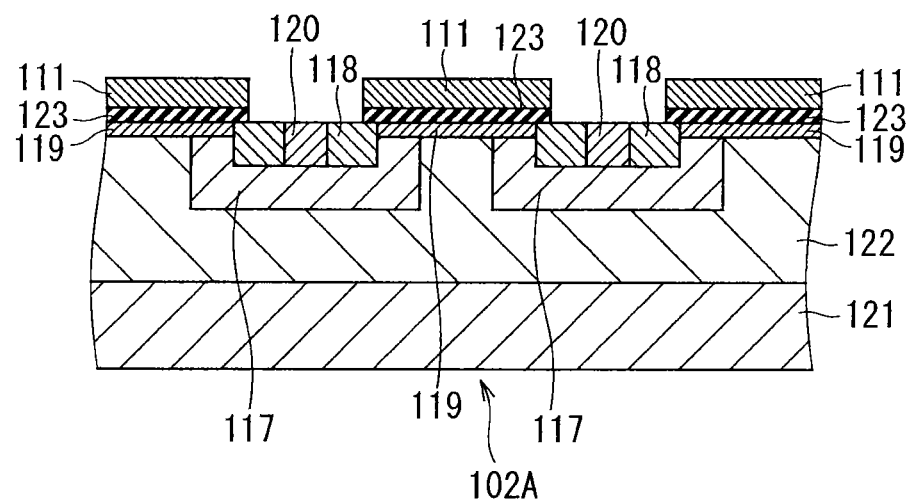
FIG. 23 is a cross-sectional view showing a state of the main cell group formation region 102A at a stage when the formation of a gate region 111 was finished.
Figure 24:
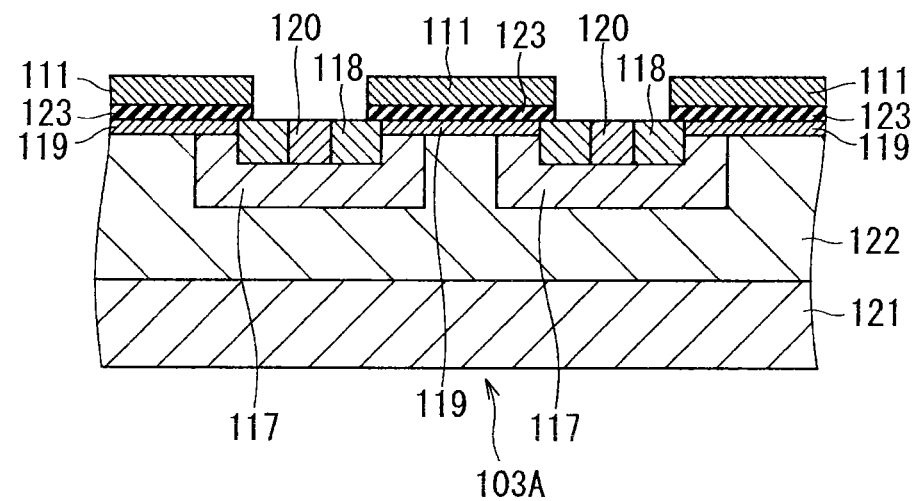
FIG. 24 is a cross-sectional view showing a state of the first sense cell group formation region 103A at the stage when the formation of the gate region 111 was finished.
Figure 25:
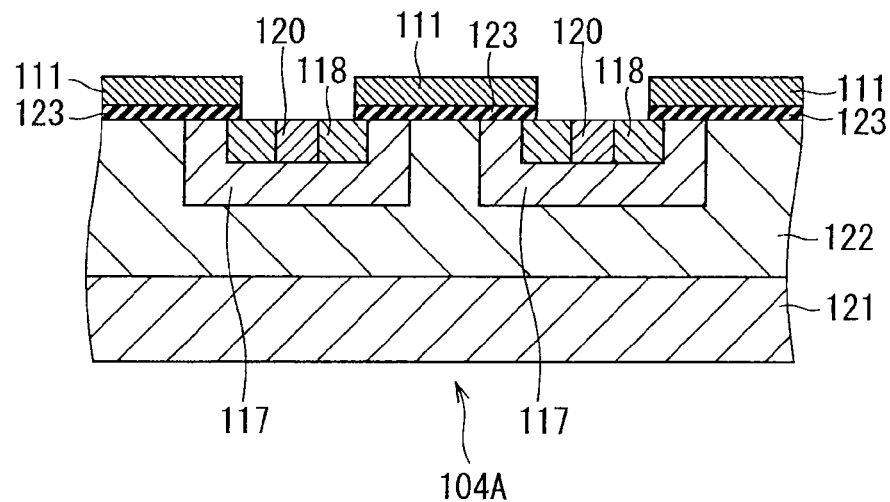
FIG. 25 is a cross-sectional view showing a state of the second sense cell group formation region 104A at the stage when the formation of the gate region 111 was finished.

FIGS. 23 to 25 are cross-sectional views showing states at a stage when the formation of the gate region 111 was finished. FIG. 23 is the cross-sectional view showing the state of the main cell group formation region 102A at the stage when the formation of the gate region 111 was finished. FIG. 24 is the cross-sectional view showing the state of the first sense cell group formation region 103A at the stage when the formation of the gate region 111 was finished. FIG. 25 is the cross-sectional view showing the state of the second sense cell group formation region 104A at the stage when the formation of the gate region 111 was finished.

After the formation of the gate conductive film 111A, the gate conductive film 111A and the gate insulating film 123 are patterned as shown in FIGS. 23 to 25, to thereby form the gate region 111. The gate conductive film 111A and the gate insulating film 123 are opened by removing the portion that covers the well contact region 120 and the source region 118 around the well contact region 120, and are patterned such that the well contact region 120 and the source region 118 around the well contact region 120 are exposed through the opening.

Figure 26:
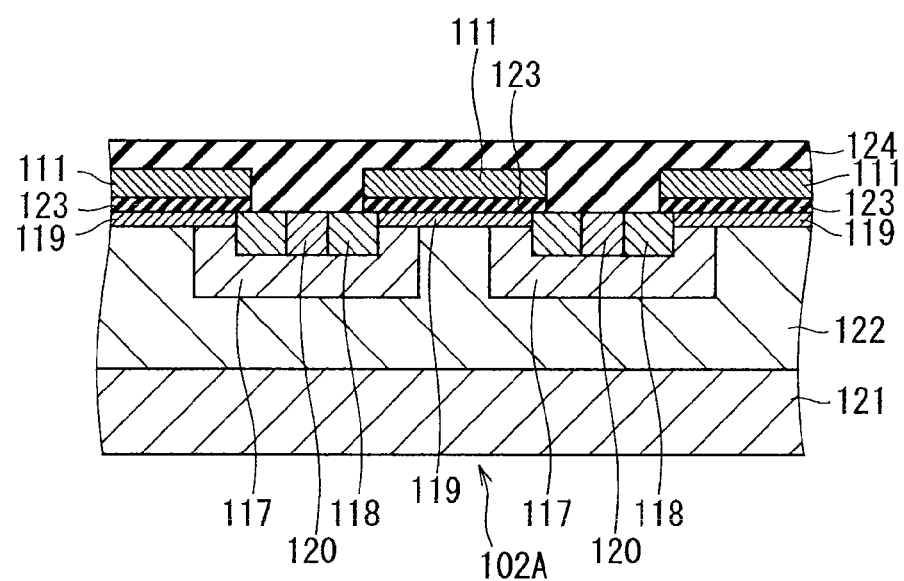
FIG. 26 is a cross-sectional view showing a state of the main cell group formation region 102A at a stage when the formation of an interlayer insulating film 124 was finished.
Figure 27:
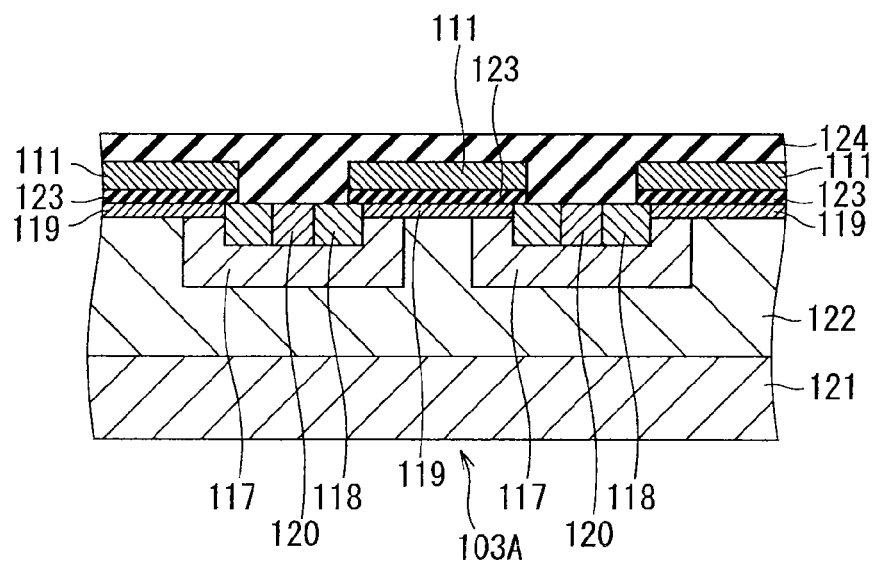
FIG. 27 is a cross-sectional view showing a state of the first sense cell group formation region 103A at the stage when the formation of the interlayer insulating film 124 was finished.
Figure 28:
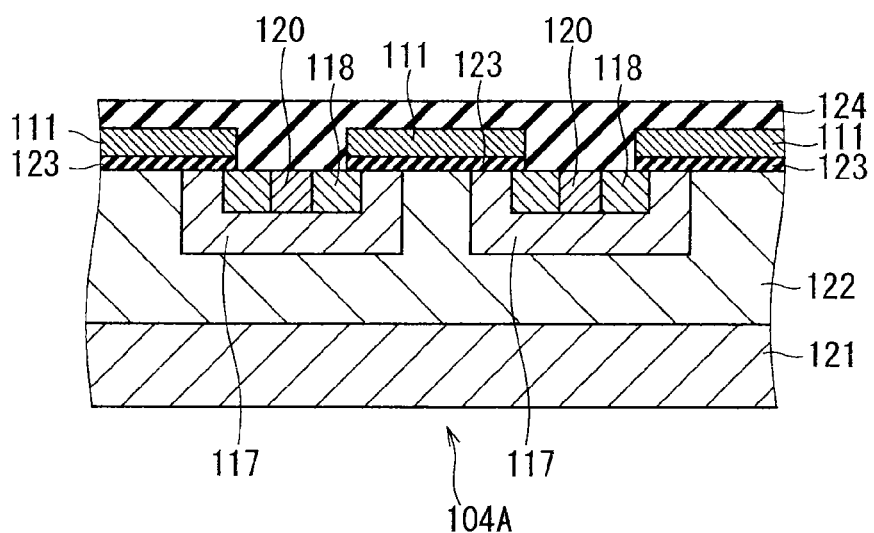
FIG. 28 is a cross-sectional view showing a state of the second sense cell group formation region 104A at the stage when the formation of the interlayer insulating film 124 was finished.

FIGS. 26 to 28 are cross-sectional views showing states at a stage when the formation of the interlayer insulating film 124 was finished. FIG. 26 is the cross-sectional view showing the state of the main cell group formation region 102A at the stage when the formation of the interlayer insulating film 124 was finished. FIG. 27 is the cross-sectional view showing the state of the first sense cell group formation region 103A at the stage when the formation of the interlayer insulating film 124 was finished. FIG. 28 is the cross-sectional view showing the state of the second sense cell group formation region 104A at the stage when the formation of the interlayer insulating film 124 was finished.

After the formation of the gate region 111, as shown in FIGS. 26 to 28, the interlayer insulating film 124 is formed by the CVD method for separating the gate region 111 and the source region 118. The interlayer insulating film 124 is formed so as to cover the gate region 111 and the gate insulating film 123, and the source region 118 and the well contact region 120 exposed through the openings of the gate region 111 and the gate insulating film 123.

Figure 31:
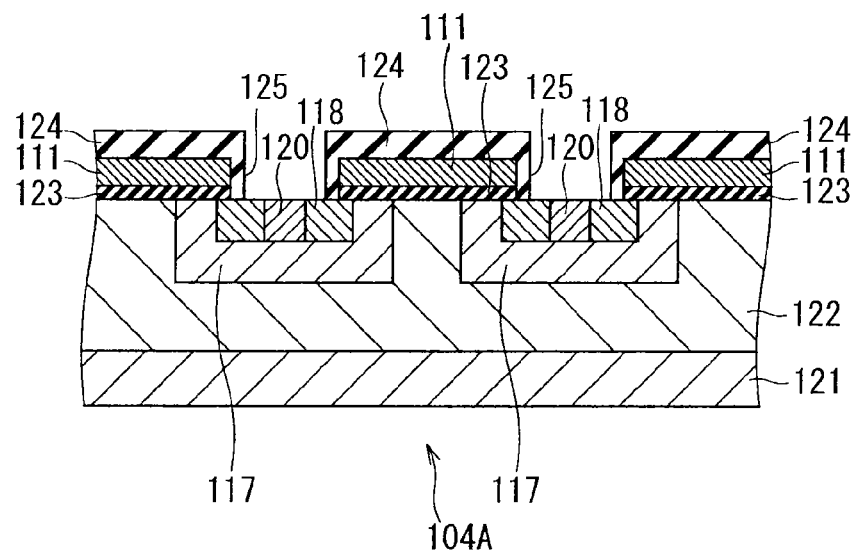
FIG. 31 is a cross-sectional view showing a state of the second sense cell group formation region 104A at the stage when the formation of the source contact hole 125 and the gate contact hole 126 was finished.
Figure 32:
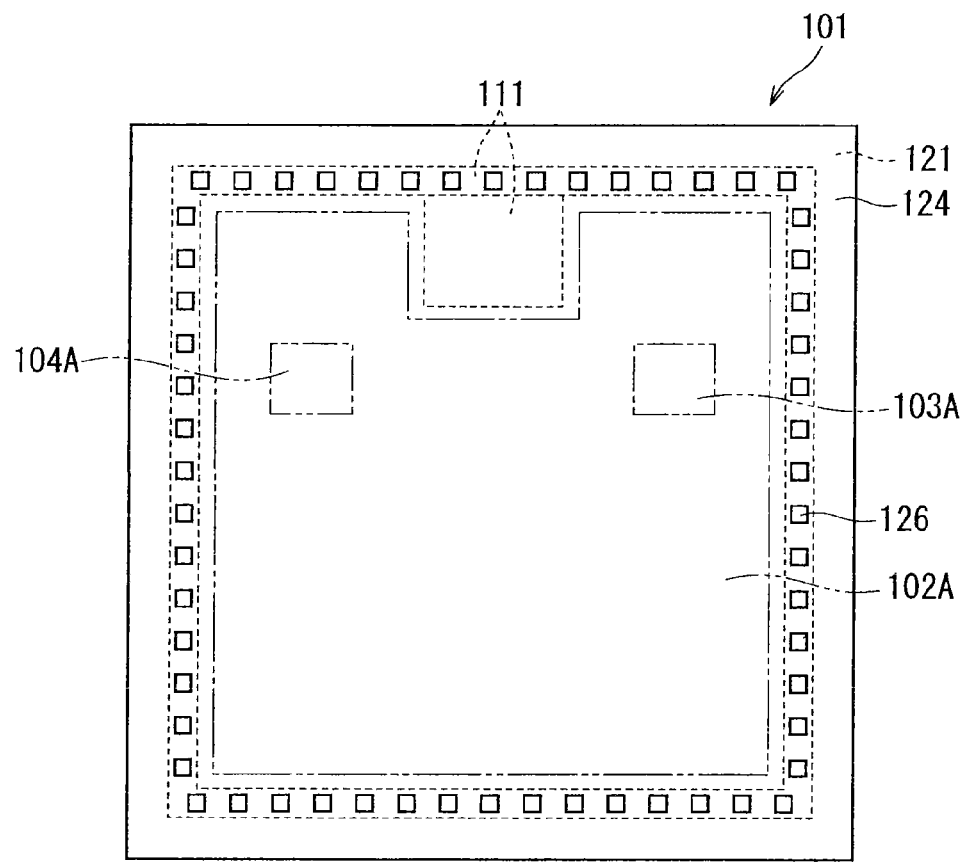
FIG. 32 is a plan view showing a state at the stage when the formation of the source contact hole 125 and the gate contact hole 126 was finished.

FIGS. 29 to 32 are views showing states at a stage when the formation of the source contact hole 125 and the gate contact hole 126 was finished. FIG. 29 is a cross-sectional view showing the state of the main cell group formation region 102A at the stage when the formation of the source contact hole 125 and the gate contact hole 126 was finished. FIG. 30 is a cross-sectional view showing the state of the first sense cell group formation region 103A at the stage when the formation of the source contact hole 125 and the gate contact hole 126 was finished. FIG. 31 is a cross-sectional view showing the state of the second sense cell group formation region 104A at the stage when the formation of the source contact hole 125 and the gate contact hole 126 was finished. FIG. 32 is a plan view showing a state at the stage when the formation of the source contact hole 125 and the gate contact hole 126 was finished.

After the formation of the interlayer insulating film 124, as shown in FIGS. 29 to 32, the interlayer insulating film 124 is opened so as to come into contact with each of the source region 118 and the gate region 111, to thereby form the source contact hole 125 and the gate contact hole 126. As a result, the well contact region 120 and the source region 118 around the well contact region 120 are exposed through the source contact hole 125. In addition, the gate region 111 is exposed through the gate contact hole 126. While FIG. 32 does not show the source contact hole 125 for easy understanding, as shown in FIGS. 29 to 31, the source contact hole 125 is formed in each of the main cell group formation region 102A, the first sense cell group formation region 103A, and the second sense cell group formation region 104A.

Then, as shown in FIGS. 5 to 7 described above, the main source electrode 106, the first sense source electrode 107, and the second sense source electrode 108 are formed. The main source electrode 106, the first sense source electrode 107, and the second sense source electrode 108 are formed to fill the source contact hole 125 and cover the interlayer insulating film 124, and the source region 118 and the well contact region 120 exposed through the source contact hole 125.

Then, as shown in FIG. 4 described above, the gate electrode 105 is formed. The gate electrode 105 is formed to fill the gate contact hole 126 and cover the interlayer insulating film 124 and the gate region 111 that is exposed through the gate contact hole 126. Then, as shown in FIGS. 5 to 7, the drain electrode 115 is formed on the surface of the Z2 side in the thickness direction of the SiC substrate 121. As a result, the vertical MOSFET 101 shown in FIGS. 4 to 7 is completed.

The sensor circuit 144, the gate drive circuit 145, and the like are connected to the MOSFET 101 formed in this manner as shown in FIG. 34 described below, to thereby obtain the semiconductor device 100.

Next, the operation of the MOSFET 101 in the semiconductor device 100 of the present embodiment is described. As described above, the main cell group 102 and the first sense cell group 103 have a different channel structure from that of the second sense cell group 104. Specifically, in addition to a similar structure to that of the second sense cell group 104, the n-type channel region 119 is formed in the main cell group 102 and the first sense cell group 103. Accordingly, the main cell group 102 and the first sense cell group 103 have a smaller threshold voltage than that of the second sense cell group 104. A difference in threshold voltage appears as a difference in temperature characteristics.

The temperature characteristics show changes in electrical characteristics to changes in temperature of the MOSFET 101, specifically, changes in internal temperature of the MOSFET 101, that is, the temperature dependence of electrical characteristics. The electrical characteristics are, for example, current-voltage characteristics showing the relationship between a drain current and a drain voltage. That is, the main cell group 102 and the first sense cell group 103 have, for example, different temperature dependence of current-voltage characteristics from that of the second sense cell group 104.

The first sense cell group 103 and the second sense cell group 104 include the gate electrode 105 and drain electrode 115 common thereto, and thus are capable of sensing, simultaneously with driving of the MOSFET 101, the internal temperature of the MOSFET 101 through comparison between the electrical characteristics of the first sense cell group 103 and the electrical characteristics of the second sense cell group 104.

Specifically, the first sense cell group 103 and the second sense cell group 104 are incorporated in the MOSFET 101 being the same semiconductor transistor, and thus show the same temperature. As described above, also, the first sense cell group 103 and the second sense cell group 104 have, for example, different temperature dependences of current-voltage characteristics. The temperature dependence of current-voltage characteristics in the first sense cell group 103 and the second sense cell group 104 appears as a difference between a value of a current flowing through the first sense cell group 103 (hereinafter, referred to as a "first sense current" at times) and a value of a current flowing through the second sense cell group 104 (hereinafter, referred to as a "second sense current" at times). Therefore, the temperature of the MOSFET 101, specifically, the internal temperature of the MOSFET 101 can be sensed based on a value of the first sense current and a value of the second sense current.

The main cell group 102 and the first sense cell group 103 have the same cell structure, and are capable of sensing the current flowing through the main cell group 102 (hereinafter, referred to as a "main current" at times) from the value of the first sense current flowing through the first sense cell group 103 and the ratio of the number of cells between the main cell group 102 and the first sense cell group 103.

FIG. 33 is a graph showing an example of the temperature dependence of a ratio between the first sense current and the second sense current during the operation of the MOSFET 101. The vertical axis of FIG. 33 represents a ratio between the first sense current and the second sense current, specifically, a value obtained by dividing the first sense current by the second sense current (first sense current/second sense current), that is, a ratio of the value of the first sense current to the value of the second sense current (hereinafter, referred to as a "sense current ratio" at times).

The horizontal axis of FIG. 33 represents the internal temperature of the MOSFET 101. The main cell group 102, the first sense cell group 103, and the second sense cell group 104 are incorporated in the MOSFET 101 being the same semiconductor transistor, and thus show the same internal temperature. Therefore, the internal temperature of the MOSFET 101 that is indicated by the horizontal axis of FIG. 33 is the internal temperature in each of the main cell group 102, the first sense cell group 103, and the second sense cell group 104.

The graph shown in FIG. 33 reveals that the internal temperature of the MOSFET 101 and the sense current ratio (first sense current/second sense current) are in proportional relation. Therefore, it is possible to sense the internal temperature of the MOSFET 101 if a value of the first sense current and a value of the second sense current are obtained.

According to the graph shown in FIG. 33, for example, the sensor circuit 144 shown in FIG. 34 described below derives a value of the sense current ratio (first sense current/second sense current) from the computation, and the gate drive circuit 145 controls driving of the MOSFET 101 based on the derived sense current ratio, whereby the MOSFET 101 can be protected from an over-temperature state. In this case, the gate drive circuit 145 functions as a protection circuit. Specifically, the MOSFET 101 can be protected from an over-temperature state by the design in which the protection circuit operates, that is, the gate drive circuit 145 interrupts driving of the MOSFET 101, upon the sense current ratio becoming, for example, 0.8 or smaller as an over-temperature.

The slope of the straight line and the value of the sense current ratio, which are shown in the graph in FIG. 33, can be controlled easily by the design with a changeable ratio between the number of cells of the first sense cell group 103 and the number of cells of the second sense cell group 104.

FIG. 34 is an electrical circuit diagram showing the configuration of the semiconductor device 100 according to one embodiment of the present invention. The semiconductor device 100 of the present embodiment includes the MOSFET 101, the main source terminal 112, the first sense source terminal 113, the second sense source terminal 114, the drain terminal 116, a gate terminal 141, a first sense resistor 142, a second sense resistor 143, the sensor circuit 144, and the gate drive circuit 145. The gate drive circuit 145 corresponds to a control circuit.

The MOSFET 101 includes the main cell group 102, the first sense cell group 103, and the second sense cell group 104. The semiconductor device 100 is connected to the load L via the drain terminal 116 and drives the load L.

FIG. 34 shows a case in which one cell constituting the main cell group 102, one cell constituting the first sense cell group 103, and one cell constituting the second sense cell group 104 are connected in parallel for easy under standing. In actuality, however, the main cell group 102, the first sense cell group 103, and the second sense cell group 104 each include a plurality of cells, and the plurality of cells are connected in parallel.

The main cell group 102 has a larger number of cells included therein, that is, includes a larger number of cells compared with the first and second sense cell groups 103 and 104, for supplying a current sufficient for driving the load L from a power source 147 to the load L. The first and second sense cell groups 103 and 104 are provided for sensing the internal temperature of the MOSFET 101 and are merely required to obtain the current sufficient for sensing the temperature, and thus have a smaller number of cells compared with the main cell group 102. As a result, a relatively large current flows through the main cell group 102, whereas a relatively small current flows through the first and second sense cell groups 103 and 104.

The ratio among the number of cells included in the main cell group 102 (hereinafter, referred to as the "number of main cells" at times), the number of cells included in the first sense cell group 103 (hereinafter, referred to as the "number of first sense cells" at times), and the number of cells included in the second sense cell group 104 (hereinafter, referred to as the "number of second sense cells" at times) is, for example, 1,000:1:1. The ratio among the number of main cells, the number of first sense cells, and the number of second sense cells is not limited thereto.

As shown in FIG. 34 and FIGS. 4 to 7 above, the drain electrode 115 of the main cell group 102, the drain electrode 115 of the first sense cell group 103, and the drain electrode 115 of the second sense cell group 104 are electrically connected, and are connected to the drain terminal 116 common thereto. The drain terminal 116 is connected to one end of the load L and an anode of a reflux diode 146. The load L and the reflux diode 146 are connected in parallel to each other. The other end of the load L and a cathode of the reflux diode 146 are connected to the power source 147. The load L is, for example, a power converter circuit of a power converter. The load L is not limited thereto and may be, for example, a motor. The reflux diode 146 has a function of refluxing a load current flowing through the load when the MOSFET 101 turns off.

The gate electrode 105 of the main cell group 102, the gate electrode 105 of the first sense cell group 103, and the gate electrode 105 of the second sense cell group 104 are electrically connected and are connected to the gate terminal 141 common thereto. The main source electrode 106 being a source electrode of the main cell group 102 is connected to the main source terminal 112. The first sense source electrode 107 being a source electrode of the first sense cell group 103 is connected to the first sense source terminal 113. The second sense source electrode 108 being a source electrode of the second sense cell group 104 is connected to the second sense source terminal 114.

The main source terminal 112 is connected to the ground. The first sense source terminal 113 is connected to one end of the first sense resistor 142. The other end of the first sense resistor 142 is connected to the ground. The second sense source terminal 114 is connected to one end of the second sense resistor 143. The other end of the second sense resistor 143 is connected to the ground. The first sense source terminal 113 and the second sense source terminal 114 are each connected to the sensor circuit 144. The sensor circuit 144 is connected to the gate drive circuit 145. The gate drive circuit 145 is connected to the gate terminal 141.

The sensor circuit 144 senses the first sense current being a current flowing through the first sense cell group 103 based on a value of voltage drop of the first sense resistor 142. The sensor circuit 144 senses the second sense current being a current flowing through the second sense cell group 104 based on a value of voltage drop of the second sense resistor 143.

The sensor circuit 144 senses a value of a main current being a current flowing through the main cell group 102 (hereinafter, referred to as a "main current value" at times) based on a value of the first sense current (hereinafter, referred to as a "first sense current value"). A main current signal including the main current value sensed by the sensor circuit 144 is supplied from the sensor circuit 144 to the gate drive circuit 145.

The sensor circuit 144 compares the value of the first sense current and the value of the second sense current to sense internal temperature information that is the information regarding the internal temperature of the MOSFET 101. The internal temperature information corresponds to the temperature information. The internal temperature information may be the internal temperature of the MOSFET 101 itself, which may be, for example, a sense current ratio being a ratio of the value of the first sense current to the value of the second sense current. An internal temperature signal including the internal temperature information sensed by the sensor circuit 144 is supplied from the sensor circuit 144 to the gate drive circuit 145.

The gate drive circuit 145 controls driving of the MOSFET 101 based on a drive signal supplied from the outside. Specifically, the gate drive circuit 145 supplies a drive signal including a gate voltage for driving the MOSFET 101 to the gate terminal 141 based on the drive signal supplied from the outside, to thereby drive the MOSFET 101. The MOSFET 101 operates based on the gate voltage included in the drive signal supplied from the gate drive circuit 145 via the gate terminal 141. The MOSFET 101 turns on in this manner, and then a current flows from the power source 147 to the load L, whereby the current flows through the main cell group 102, the first sense cell group 103, and the second sense cell group 104 via the drain terminal 116.

The gate drive circuit 145 controls driving of the MOSFET 101 based on internal temperature information that is sensed by the sensor circuit 144 and is included in an internal temperature signal supplied from the sensor circuit 144. When the internal temperature information included in the internal temperature signal supplied from the sensor circuit 144 satisfies predetermined conditions, the gate drive circuit 145 supplies an interruption signal for interrupting driving of the MOSFET 101 to the gate terminal 141, to thereby interrupt driving of the MOSFET 101.

For example, in a case where the internal temperature information is a sense current ratio, the gate drive circuit 145 compares a value of a sense current ratio included in the internal temperature signal supplied from the sensor circuit 144 with a predetermined internal temperature threshold. Then, in a case where the value of the sense current ratio is equal to or smaller than the internal temperature threshold, the gate drive circuit 145 supplies an interruption signal for interrupting driving of the MOSFET 101 to the gate terminal 141, to thereby interrupt driving of the MOSFET 101. If the internal temperature of the MOSFET 101 and the sense current ratio are in proportional relation shown in FIG. 33 as described above, the internal temperature threshold is selected to, for example, 0.8. In this case, the gate drive circuit 145 judges that the value of the sense current ratio is equal to or smaller than 0.8 and then supplies an interruption signal to the gate terminal 141, to thereby interrupt driving of the MOSFET 101.

The gate drive circuit 145 controls driving of the MOSFET 101 based on the main current value included in the main current signal supplied from the sensor circuit 144. Specifically, the gate drive circuit 145 compares the main current value included in the main current signal supplied from the sensor circuit 144 with a predetermined main current threshold. Then, in a case where the main current value exceeds the main current threshold, the gate drive circuit 145 supplies an interruption signal for interrupting driving of the MOSFET 101 to the gate terminal 141, to thereby interrupt driving of the MOSFET 101.

The gate terminal 141 is supplied with the interruption signal in this manner, whereby driving of the MOSFET 101 is interrupted. In a case where the internal temperature information satisfies predetermined conditions, for example, in a case where the value of the sense current ratio is equal to or smaller than the internal temperature threshold and in a case where the main current value is equal to or smaller than the main current threshold, the gate terminal 141 is not supplied with the interruption signal. Accordingly, the MOSFET 101 is driven based on the gate voltage.

As described above, in the semiconductor device 100 of the present embodiment, the sensor circuit 144 senses the internal temperature information regarding the internal temperature of the MOSFET 101 based on the value of the first sense current flowing through the first sense cell group 103 and the value of the second sense cell current flowing through the second sense cell group 104. In this manner, the first and second sense cell groups 103 and 104 function as a temperature sensing element for sensing the internal temperature of the MOSFET 101.

The first sense cell group 103 and the second sense cell group 104 have different channel structures, and thus have different threshold voltages. In the present embodiment, the second sense cell group 104 is set to have a higher threshold voltage than that of the first sense cell group 103. Specifically, the threshold voltage of the second sense cell group 104 is set to be higher than the threshold voltage of the first sense cell group 103 by approximately 1.6 V to 1.8 V.

A difference in threshold voltage leads to a difference in temperature dependence of current-voltage characteristics as described above. On the contrary, the first sense cell group 103 and the second sense cell group 104 are incorporated in the MOSFET 101 that is the same semiconductor transistor, and thus show the same internal temperature. Accordingly, a difference in temperature dependence of current-voltage characteristics between the first sense cell group 103 and the second sense cell group 104 appears as a difference between a value of the first sense current and a value of the second sense current. Therefore, through sensing of the internal temperature information regarding the internal temperature of the MOSFET 101 by the sensor circuit 144 based on a value of the first sense current and a value of the second sense current as described above, the internal temperature information regarding the internal temperature of the MOSFET 101 can be sensed rapidly and accurately.

The first and second sense cell groups 103 and 104 are incorporated in the MOSFET 101 that is the same semiconductor transistor as that of the main cell group 102, and thus, the internal temperature information regarding the internal temperature of the MOSFET 101 can be sensed more rapidly and more accurately compared with the conventional art in which a temperature is sensed with a temperature sensing diode on an insulating film.

In the semiconductor device 100 of the present embodiment, the main cell group 102 and the first sense cell group 103 have different temperature characteristics from those of the second sense cell group 104 due to different channel structures. However, the main cell group 102, the first sense cell group 103, and the second sense cell group 104 have the same structure except for the channel structure, and thus can be manufactured simultaneously. That is, differently from the conventional art, additional processes for forming a temperature sensing diode, for example, a deposition process and an etching process are not required in manufacturing the semiconductor device 100 of the present embodiment. Therefore, according to the present embodiment, the above-mentioned function of rapidly and accurately sensing the internal temperature information regarding the internal temperature of the MOSFET 101 can be achieved while suppressing an increase of manufacturing steps. This enables to reduce the cost and time required for manufacturing the semiconductor device 100.

In the present embodiment, the first sense cell group 103 and the second sense cell group 104 have different channel structures. The configurations as described above enable to achieve the first sense cell group 103 and the second sense cell group 104 having different temperature characteristics as described above.

In the present embodiment, the second sense cell group 104 is set to have a higher threshold voltage than that of the first sense cell group 103. More specifically, the main cell group 102 and the first sense cell group 103 have a smaller threshold voltage than that of the second sense cell group 104 as described above. Accordingly, in the switching operation of the MOSFET 101, the second sense cell group 104 turns on more slowly and turns off faster compared with the other cell groups, that is, the main cell group 102 and the first sense cell group 103. This mitigates noise in switching, whereby it is possible to prevent false sensing of an over-temperature.

In the present embodiment, the main cell group 102 and the first sense cell group 103 have the same channel structure, and the semiconductor device 100 senses a value of the main current flowing through the main cell group 102 based on a value of the first sense current flowing through the first sense cell group 103 by the sensor circuit 144. In this case, the first sense cell group 103 functions as a current sensing element for sensing a current. As described above, the first and second sense cell groups 103 and 104 function as a temperature sensing element for sensing the internal temperature of the MOSFET 101.

That is, the semiconductor device 100 of the present embodiment corresponds to a semiconductor device containing a temperature sensing element as well as a current sensing element and has functions of sensing a temperature as well as sensing a current. Therefore, the semiconductor device 100 of the present embodiment can sense an over-temperature state of the MOSFET 1 with the first and second sense cell groups 103 and 104 and sense an over-current state of the MOSFET 1 with the first sense cell group 103.

In a case where, for example, the technology described in Patent Document 1 and the technology described in Patent Document 2 are combined for achieving a semiconductor device containing a temperature sensing element as well as a current sensing element in the conventional art, an anode electrode and a cathode electrode of the temperature sensing diode and a source electrode of the current sensing cell need to be formed on a semiconductor transistor. In the conventional art, therefore, an effective area of a semiconductor transistor may be reduced.

Meanwhile, it suffices that in order to achieve temperature sensing and current sensing in the semiconductor device 100 of the present embodiment, two sense cell groups, that is, the first and second sense cell groups 103 and 104 are provided in addition to the main cell group 102. On this occasion, the main cell group 102 and the two sense cell groups 103 and 104 can share the drain electrode 115 and the gate electrode 105. Accordingly, the number of electrodes of the MOSFET 101 being a semiconductor transistor can be reduced in the present embodiment compared with the conventional art. This enables to increase an effective area of a semiconductor transistor compared with the conventional art.

Therefore, in the present embodiment, a semiconductor device containing a temperature sensing element as well as a current sensing element, specifically, the semiconductor device 100 having functions of sensing a temperature as well as sensing a current can be achieved without reducing an effective area of the semiconductor transistor.

As described above, the main cell group 102 and the first and second sense cell groups 103 and 104 can be manufactured at the same time. Therefore, differently from the conventional art, additional processes for forming a temperature sensing diode, for example, a deposition process and an etching process are not required in manufacturing the semiconductor device 100 of the present embodiment. Therefore, the semiconductor device 100 capable of sensing a temperature as well as sensing a current can be manufactured in fewer manufacturing steps compared with the conventional art.

In the semiconductor device 100 of the present embodiment, the sensor circuit 144 senses the sense current ratio that is a ratio of a value of the first sense current to a value of the second sense current as the internal temperature information, and the gate drive circuit 145 controls driving of the MOSFET 101 based on the sensed sense current ratio. In this case, it suffices that the sensor circuit 144 obtains a sense current ratio from a value of the first sense current and a value of the second sense current and does not need to obtain the internal temperature of the MOSFET 101. Therefore, the computation process by the sensor circuit 144 can be more simplified compared with the case where the internal temperature of the MOSFET 101 is obtained. This enables to achieve the sensor circuit 144 with a simple configuration, and thus, the configuration of the semiconductor device 100 can be simplified.

While the present embodiment has described the MOSFET 101 having a configuration in which the channel structure of the main cell group 102 and the channel structure of the first sense cell group 103 are identical to each other, and the channel structure of the second sense cell group 104 is different from the channel structure of the main cell group 102, the MOSFET is not necessarily limited to the configuration as described above. It suffices that in the MOSFET, the channel structure of the first sense cell group 103 is different from the channel structure of the second sense cell group 104. Through comparison and computation of values of currents flowing through the first and second sense cell groups 103 and 104, it is possible to accurately sense the internal temperature of the MOSFET 101. On this occasion, it is not required to limit the channel structure of the main cell group 102.

While the present embodiment has described the semiconductor device 100 including the MOSFET 101 as a semiconductor transistor, a semiconductor transistor is not limited to a MOSFET. A semiconductor transistor may be, for example, an insulated gate bipolar transistor (abbreviated as IGBT). Similar effects to those of the present embodiment can be achieved also in a case where a semiconductor transistor is an IGBT.

While the present embodiment has described a semiconductor device including a wide bandgap semiconductor having a larger bandgap than that of silicon (Si), specifically, silicon carbide (SiC), as a semiconductor material that is a main material of a semiconductor transistor such as the MOSFET 101, the semiconductor material is not limited thereto. Specifically, though a semiconductor material is not limited to a wide bandgap semiconductor and may be Si, it is preferable to use a wide bandgap semiconductor as in the present embodiment. The wide bandgap semiconductor is not limited to SiC. Examples of the wide bandgap semiconductor other than SiC include gallium-nitride-based materials such as gallium nitride (GaN) and diamond.

A semiconductor transistor formed of a wind bandgap semiconductor (hereinafter, referred to as a "wide bandgap semiconductor transistor" at times) has higher withstand voltage characteristics and a higher allowable current density than those of a semiconductor transistor formed of Si (hereinafter, referred to as a "Si transistor" at times). Accordingly, a semiconductor transistor can be downsized with the use of a wide bandgap semiconductor. The use of a downsized semiconductor transistor as described above enables to downsize a semiconductor module that is a semiconductor device including those semiconductor transistors incorporated as elements. A wide bandgap semiconductor has a lower power loss compared with Si. Accordingly, the use of a wide bandgap semiconductor enables to enhance the efficiency of a semiconductor transistor, leading to higher efficiency of a semiconductor module.

A wide bandgap semiconductor transistor is capable of operating at a higher internal temperature than that of a Si transistor. For example, a SiC transistor mainly formed of SiC is capable of operating at an internal temperature of 200° C. or higher.

As described above, in the present embodiment, the internal temperature information of the MOSFET 101 is sensed rapidly and accurately by the sensor circuit 144, and driving of the MOSFET 1 is controlled rapidly based on the sensed internal temperature information, whereby the MOSFET 101 can be protected. With the use of a wide bandgap semiconductor transistor such as a SiC transistor as a transistor of the above-mentioned semiconductor device, the semiconductor transistor can be operated safely even if an internal temperature thereof becomes 200° C. or higher. This enables to extend the range of safe operating temperature of the semiconductor device 100 including the gate drive circuit 145 as a protection circuit. In other words, the semiconductor device 100 having a wider range of safe operation temperature can be achieved.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS 1, 101 MOSFET, 2, 102 main cell group, 3 sense cell group, 4, 116 drain terminal, 5 source terminal, 6 sense terminal, 7, 141 gate terminal, 8 sense resistor, 9 Hall current sensor, 10 temperature sensing circuit, 11 gate control circuit, 12 operational amplifier, 13 amplifier resistor, 20, 21, 100 semiconductor device, 103 first sense cell group, 104 second sense cell group, 105 gate electrode, 106 main source electrode, 107 first sense source electrode, 108 second sense source electrode, 110 cell, 111 gate region, 112 main source terminal, 113 first sense source terminal, 114 second sense source terminal, 115 drain electrode, 117 base region, 118 source region, 119 channel region, 120 well contact region, 121 silicon carbide substrate, 122 silicon carbide drift layer, 123 gate insulating film, 124 interlayer insulating film, 125 source contact hole, 126 gate contact hole, 142 first sense resistor, 143 second sense resistor.

The invention claimed is:

1. A semiconductor device, comprising:
a semiconductor transistor being composed of a plurality of cells; and
a sensor circuit sensing temperature information regarding the temperature of said semiconductor transistor, wherein
said semiconductor transistor includes a main cell group including a cell for supplying a current to a load among said plurality of cells, and a sense cell group including a cell for sensing said temperature information thereamong,
said main cell group and said sense cell group have different temperature characteristics showing changes in electrical characteristics to changes in temperature of said semiconductor transistor, and
said sensor circuit senses said temperature information based on a value of a main current flowing through said main cell group and a value of a sense current flowing through said sense cell group.

2. The semiconductor device according to claim 1, further comprising:
main current information sensing means sensing main current information regarding said main current; and
sense current information sensing means sensing sense current information regarding said sense current,
wherein said sensor circuit is configured to:
obtain related information showing the relationship among the value of said main current, the value of said sense current, and the temperature of said semiconductor transistor in advance;
obtain the value of said main current from said main current information sensed by said main current information sensing means and obtain the value of said sense current from said sense current information sensed by said sense current information sensing means; and
sense the temperature of said semiconductor transistor as said temperature information based on the obtained value of said main current, the obtained value of said sense current, and said related information.

3. The semiconductor device according to claim 1, wherein said sense cell group is set to have a higher threshold voltage than a threshold voltage of said main cell group.

4. The semiconductor device according to claim 1, wherein said main cell group and said sense cell group have different channel structures.

5. The semiconductor device according to claim 4, wherein said main cell group and said sense cell group differ in impurity concentration of a channel region forming said semiconductor transistor.

6. The semiconductor device according to claim 1, further comprising a control circuit controlling said semiconductor transistor based on said temperature information sensed by said sensor circuit.

7. The semiconductor device according to claim 1, wherein said semiconductor transistor is formed of a wide bandgap semiconductor having a larger bandgap than a bandgap of silicon.

8. The semiconductor device according to claim 7, wherein said wide bandgap semiconductor comprises a silicon carbide, a gallium-nitride-based material, or diamond.

9. A semiconductor device, comprising:
a semiconductor transistor being composed of a plurality of cells; and
a sensor circuit sensing temperature information regarding the temperature of said semiconductor transistor, wherein
said semiconductor transistor includes a main cell group including a cell for supplying a current to a load among said plurality of cells, a sense cell group including a cell for sensing said temperature information thereamong, and another sense cell group including at least a part of the cells other than the cells included in said main cell group and said sense cell group thereamong, said another sense cell group being used for sensing said temperature information, said main cell group and said sense cell group have different temperature characteristics showing changes in electrical characteristics to changes in temperature of said semiconductor transistor, said sense cell group and said another sense cell group have different temperature characteristics showing changes in electrical characteristics to changes in temperature of said semiconductor transistor, and said sensor circuit senses said temperature information based on a value of a sense current flowing through said sense cell group and a value of another sense current flowing through said another sense cell group.

10. The semiconductor device according to claim 9, wherein said sense cell group and said another sense cell group have different channel structures.

11. The semiconductor device according to claim 9, wherein said main cell group and said another sense cell group have the same channel structure, and said sensor circuit further has a function of sensing the value of the main current flowing through said main cell group based on the value of said another sense current flowing through said another sense cell group.

12. The semiconductor device according to claim 9, wherein said sensor circuit senses a sense current ratio that is a ratio of the value of said another sense current to the value of said sense current as said temperature information.

13. The semiconductor device according to claim 9, wherein said sense cell group is set to have a higher threshold voltage than a threshold voltage of said main cell group.

14. The semiconductor device according to claim 9, wherein said main cell group and said sense cell group have different channel structures.

15. The semiconductor device according to claim 14, wherein said main cell group and said sense cell group differ in impurity concentration of a channel region forming said semiconductor transistor.

16. The semiconductor device according to claim 9, further comprising a control circuit controlling said semiconductor transistor based on said temperature information sensed by said sensor circuit.

17. The semiconductor device according to claim 9, wherein said semiconductor transistor is formed of a wide bandgap semiconductor having a larger bandgap than a bandgap of silicon.

18. The semiconductor device according to claim 17, wherein said wide bandgap semiconductor comprises a silicon carbide, a gallium-nitride-based material, or diamond.

* * * * *